US009728662B2

(12) United States Patent
Lo et al.

(10) Patent No.: US 9,728,662 B2
(45) Date of Patent: Aug. 8, 2017

(54) SEMICONDUCTOR INFRARED PHOTODETECTORS

(71) Applicant: The Regents of the University of California, Oakland, CA (US)

(72) Inventors: Yu-Hwa Lo, San Diego, CA (US);
Yuchun Zhou, San Diego, CA (US);
Yu-Hsin Liu, San Diego, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/440,321

(22) PCT Filed: Nov. 1, 2013

(86) PCT No.: PCT/US2013/068152
§ 371 (c)(1),
(2) Date: May 1, 2015

(87) PCT Pub. No.: WO2014/071244
PCT Pub. Date: May 8, 2014

(65) Prior Publication Data
US 2015/0280034 A1 Oct. 1, 2015

Related U.S. Application Data

(60) Provisional application No. 61/721,375, filed on Nov. 1, 2012.

(51) Int. Cl.
*H01L 31/18* (2006.01)
*H01L 31/0352* (2006.01)
(Continued)

(52) U.S. Cl.
CPC .. *H01L 31/035227* (2013.01); *H01L 31/0288* (2013.01); *H01L 31/022408* (2013.01);
(Continued)

(58) Field of Classification Search
CPC ....... H01L 2924/00; H01L 2924/00014; H01L 2924/01077; H01L 2924/10253;
(Continued)

(56) References Cited

U.S. PATENT DOCUMENTS

| | | | |
|---|---|---|---|
| 8,624,968 B1* | 1/2014 | Hersee | B82Y 15/00 348/79 |
| 2005/0161662 A1* | 7/2005 | Majumdar | B82Y 10/00 257/18 |

(Continued)

FOREIGN PATENT DOCUMENTS

| | | |
|---|---|---|
| WO | 2008039140 A1 | 4/2008 |
| WO | 2011044226 A2 | 4/2011 |

OTHER PUBLICATIONS

Arakawa et al., "Quantum Well Lasers-Gain, Spectra, Dynamics", IEEE Journal of Quantum Electronics, 1986, 22(9) pp. 1887-1899.
(Continued)

*Primary Examiner* — Stephen W Smoot
*Assistant Examiner* — Edward Chin
(74) *Attorney, Agent, or Firm* — Perkins Coie LLP

(57) ABSTRACT

A semiconductor device capable of enhanced sub-bandgap photon absorption and detection is described. This semiconductor device includes a p-n junction structure formed of a semiconductor material, wherein the p-n junction structure is configured such that at least one side of the p-n junction (p-side or n-side) is spatially confined in at least one dimension of the device (e.g., the direction perpendicular to the p-n junction interface). Moreover, at least one side of the p-n junction (p-side or n-side) is heavily doped. The semiconductor device also includes electrical contacts formed on a semiconductor substrate to apply an electrical bias to the p-n junction to activate the optical response at target optical wavelength corresponds to an energy substantially equal to or less than the energy band-gap of the first semiconductor
(Continued)

material. In particular embodiments, the semiconductor material is silicon.

7 Claims, 19 Drawing Sheets

(51) Int. Cl.
*H01L 31/068* (2012.01)
*H01L 31/0224* (2006.01)
*H01L 31/0288* (2006.01)

(52) U.S. Cl.
CPC .... *H01L 31/035236* (2013.01); *H01L 31/068* (2013.01); *H01L 31/1864* (2013.01); *Y02E 10/547* (2013.01)

(58) Field of Classification Search
CPC . H01L 2924/12036; H01L 2924/12042; H01L 2924/1305; H01L 2924/1306; H01L 2924/13062; H01L 2224/48; H01L 2924/00011; H01L 29/066
USPC ............... 977/762, 954, 957; 257/E33.003, 257/E33.008
See application file for complete search history.

(56) References Cited

U.S. PATENT DOCUMENTS

| | | |
|---|---|---|
| 2008/0218740 A1 | 9/2008 | Williams et al. |
| 2009/0050204 A1* | 2/2009 | Habib ............... H01L 31/03529 136/261 |
| 2010/0003516 A1 | 1/2010 | Majumdar et al. |
| 2010/0148221 A1* | 6/2010 | Yu ......................... B82Y 20/00 257/225 |
| 2011/0133061 A1* | 6/2011 | Yu ......................... B82Y 15/00 250/214.1 |
| 2011/0133160 A1* | 6/2011 | Yu ..................... H01L 27/14607 257/14 |

OTHER PUBLICATIONS

Assefa et al., "Reinventing germanium avalanche photodetector for nanophotonic on-chip optical interconnects", Nature, 2010, 464 (7285) pp. 80-84.
Cavallini, A. et al, "Franz-Keldysh Effect in GaN Nanowires," Nano Letters, 2007, 7(7), pp. 2166-2170.
Desiatov et al., "Demonstration of submicron square-like silicon waveguide using optimized LOCOS process", Optics Express 2010, 18, pp. 18592-18597.
Goykhman et al., "Locally Oxidized Silicon Surface-Plasmon Schottky Detector for Telecom Regime", Nano Letters, 2011, 11 (6), pp. 2219-2224.
International Application No. PCT/US2013/068152, International Search Report and Written Opinion, dated Feb. 27, 2014, 24 pages.
Lax et al., "Broadening of Impurity Levels in Silicon", Physical Review, 1955, pp. 592-602.
Liang et al., "Silicon waveguide two-photon absorption detector at 1.5μm wavelength for autocorrelation measurements", Applied Physics Letters, 2002, 81 (7) pp. 1323-1325.
Liang, et al. "Recent progress in lasers on silicon", Nature Photonics, 2010, 4 (8) pp. 511-517.
Liu et al. "High-speed optical modulation based on carrier depletion in a silicon waveguide", Optics Express, 2007,15, pp. 660-668.
McMeekin et al, "Franz-Keldysh effect in an optical waveguide containing a resonant tunneling diode" Applied Physics Letters, 1994, 8(8) pp. 1076-1078 .
Michel et al., "High-performance Ge-on-Si photodetectors", Nature Photonics, 2010, 4 (8) pp. 527-534.
Miller et al., "Electroabsorption of highly confined systems: Theory of the quantum-confined Franz-Keldysh effect in semiconductor quantum wires and dots", Applied Physics Letters, 1988, 93(12), pp. 2154-2156.
Milosevic et al., "Athermal and low loss ridge silicon waveguides", Proc. of SPIE, 2010, 76, 061s.
Reed et al., "Silicon optical modulators", Nature Photonics, 2010, 4 ( 8) pp. 518-526.
Rong et al., "An all-silicon Raman laser", Nature, 2005, 433 (7023) pp. 292-294.
Sherwood-Droz et al., "Oxidized Silicon-On-Insulator (OxSOI) from bulk silicon: a new photonic platform", Optics Express, 2010, 18, pp. 5785-5790.
Sze et al., "Part V—Photonic Devices And Sensors," Physics of Semiconductor Devices, 2006, 63 pages.
Wu et al., "Near-unity below-band-gap absorption by microstructured silicon", Applied Physics Letters, 2001, 78, pp. 1850-1852.
Zhang et al., "Silicon Nanowire detectors showing phototransistive gain", Applied Physics Letter, 2008, 4 pages.
Zhang et al., "Ultrahigh Responsivity Visible and Infrared Detection Using Silicon Nanowire Phototransistors", Nano Letters, 2010, 10 (6), pp. 2117-2120.

* cited by examiner

Silicon Photodetector 1400

SEMICONDUCTOR INFRARED PHOTODETECTORS

PRIORITY CLAIM AND RELATED PATENT APPLICATION

This patent document is a 35 USC 371 National Stage application of International Application No. PCT/US2013/068152 filed Nov. 1, 2013, which further claims the benefit of U.S. Provisional Application No. 61/721,375 entitled "NANOSTRUCTURED SEMICONDUCTOR INFRARED PHOTODETECTORS" and filed Nov. 1, 2012, the disclosures of which are incorporated by reference as part of the specification of this document.

STATEMENT OF GOVERNMENT SUPPORT

This invention was made with government support under grant 323308 W909MY-11-C-0080 awarded by the United States Army. The government has certain rights in the invention.

BACKGROUND

Nanotechnology provides techniques or processes for fabricating structures, devices, and systems with features at a molecular or atomic scale, e.g., structures in a range of one to hundreds of nanometers in some applications. In particular, silicon nanostructures have attracted enormous attention in the past two decades due to their unique optical properties that cannot be observed in their bulk counterparts. Specifically for silicon photonics, various nanoscale devices can include high speed optical modulators, low loss waveguides, and even laser sources.

SUMMARY

Embodiments described in this document provide techniques, devices and systems that implement various semiconductor microstructures and nanostructures that exhibit voltage dependence of photoresponse to both near bandgap and infrared sub-bandgap optical radiations. Moreover, this patent document discloses the first realization of enhanced sub-bandgap optical absorption of silicon using either vertical core-shell silicon nanowires or waveguide-coupled silicon homojunction structures.

In one aspect, a semiconductor device to detect light (e.g., including a photoresponse to sub-bandgap photons) includes a p-n junction structure formed of a semiconductor material, wherein the p-n junction structure is configured such that at least one type of carriers (e.g., electrons or holes) is spatially confined to a regime less than 1000 nm in at least one dimension of the device (e.g., the direction perpendicular to the p-n junction interface). Moreover, at least one side of the p-n junction (e.g., p-side or n-side) is heavily doped (e.g., doping concentration $>1\times10^{18}$ cm$^{-3}$). The semiconductor device also includes electrical contacts formed on a semiconductor substrate (which supports the semiconductor device) to apply an electrical bias to the p-n junction to activate the optical response at target optical wavelength corresponds to an energy substantially equal to or less than the energy band-gap of the first semiconductor material. In some embodiments, at least part of the light energy being detected presides the area around the metallurgical junction. In particular embodiments, the semiconductor material is silicon.

The exemplary semiconductor device implements p-n junction structure configurations that can effectuate a Franz-Keldysh effect, a quasi-quantum confinement effect, and an impurity-state assisted photon absorption in the p-n junction structure to enhance the optical response of the semiconductor device at the target optical wavelength. Such p-n junction structure configurations can include, but are not limited to the spatial confinement in at least one dimension of the p-n junction structure and the high doping level in at least one-side of the p-n junction structure.

In another aspect, a photodetector device utilizes a p-n junction structure configured in the form of nanowires. The proposed nanowire photodetector device can include a substrate formed of a first doped semiconductor material, the substrate including a first region and a second region, an array of multilayered nanowire structures protruding from the first region of the substrate, in which the nanowire structures are formed of the first doped semiconductor material covered by a first layer of a second doped semiconductor material to form core-shell nanowire structures. The first layer of the core-shell nanowire structures are covered by an insulating layer to provide electrical isolation of the nanowire structures. Electrodes are formed in the second region of the substrate and coupled to the first layer of the array of multilayered nanowire structures. Hence, the multilayered nanowire structures in the first region function as an optical active region capable of detecting infrared sub-bandgap optical radiation that generates an electrical signal presented at the electrode.

In yet another aspect, a semiconductor device can include a semiconductor substrate made of a first semiconductor material of a first type conductivity and having an energy band-gap to exhibit an optical response only at a characteristic optical wavelength corresponding to an energy equal to or greater than the energy band-gap. The photodetector device also includes a semiconductor multilayer structure of the first semiconductor material fabricated on the semiconductor substrate. One or more layers of a second semiconductor material of a second type conductivity are formed over the semiconductor multilayer structure to form a p-n junction structure which exhibits an optical response at a long optical wavelength corresponding to an energy less than the energy band-gap and longer than the characteristic optical wavelength. The photodetector device also includes electrical contacts formed on the semiconductor substrate to apply an electrical bias to the p-n junction structure to activate the optical response at the long optical wavelength.

In some implementations, the above-mentioned semiconductor multilayer structure of the first semiconductor material includes an array of nanowires, and the above-mentioned p-n junction structure comprises an array of p-n junctions, each p-n junction formed by each nanowire coated by the one or more layers of the second semiconductor material of the second type conductivity.

In some implementations, the above-mentioned semiconductor multilayer structure of the first semiconductor material is formed by epitaxial deposition over the semiconductor substrate, and the one or more layers of the second semiconductor material is formed by epitaxial deposition over the semiconductor multilayer structure, and the p-n junction structure comprises a stack of epitaxial layers. The p-n junction structure can have a ring geometry or disk geometry in the substrate plane. The device can also include a waveguide coupled to the p-n junction structure to guide an optical signal to be detected to the p-n junction structure.

In one aspect, a device to detect light is disclosed. This device includes a substrate formed of a first doped semiconductor material, wherein the substrate includes a first region and a second region, wherein the second region includes an electrically insulating layer formed over the surface. The device also includes an array of multilayered nanowire structures protruding from the first region of the substrate, wherein the nanowire structures are formed of the first doped semiconductor material covered by a first layer of a second doped semiconductor material forming a core-shell structure, the first layer covered by an insulating layer providing electrical isolation of the nanowire structures. The device additionally includes an electrode formed in the second region and coupled to the first layer of the array of multilayered nanowire structures. The multilayered nanowire structures in the first region function as an optical active region capable of detecting infrared sub-bandgap optical radiation that generates an electrical signal presented at the electrode.

In some implementations of the above device, the first doped semiconductor material includes p-type silicon.

In some implementations of the above device, the second doped semiconductor material includes n-type silicon.

In some implementations of the above device, the insulating layer includes silicon oxide.

In some implementations of the above device, the electrically insulating layer and the insulating layer are the same material.

In one aspect, a method to fabricate a photodetector device is described. The method include: a step to form a patterned mask on a first region of a first substrate formed of a first doped semiconductor material, wherein the patterned mask partially covers the surface of the first region of the first substrate while exposing the surface in an array of selected regions to be removed by etching; a step to etch the first doped semiconductor material from the array of selected regions of the first substrate to form an array of multilayered nanostructures protruding from the first substrate; a step to remove the patterned mask; a step to combine the first substrate with a second substrate having a surface with coating including a dopant such that the nanostructured array-patterned surface of the first substrate is substantially separated from the dopant-coated surface of the second substrate by a distance; a step to anneal the combined first and second substrates such that the dopant evaporates from the second substrate and precipitates on the nanostructured array-patterned surface to form a first layer of a second doped semiconductor material covering the nanostructures in the first region; a step to deposit an electrically insulating material on the first layer of the nanostructured array-patterned surface to form a second layer covering the nanostructures in the first region and over the surface of a second region of the first substrate, wherein the depositing includes forming one or more openings exposing the first layer in the first region; a step to deposit an electrically conductive material on the second layer in the second region to form an electrode and over the one or more openings in the first region leading to the electrode such that the electrode is coupled to the second doped semiconductor material via the one or more openings. The method produces a photodetector device is capable of detecting infrared sub-bandgap optical radiation to generate an electrical signal presented at the electrode.

In some implementations of the above method, the patterned mask includes nickel material.

In some implementations of the above method, the first doped semiconductor material includes Boron-doped p-type silicon.

In some implementations of the above method, the dopant includes phosphorous.

In some implementations of the above method, the second doped semiconductor material includes n-type silicon.

In some implementations of the above method, the electrically insulating layer includes silicon oxide.

In some implementations of the above method, the distance is substantially 1 mm.

In some implementations of the above method, the annealing includes applying heat to the combined first and second substrates with a temperature substantially 950° C. for 35 seconds.

In another aspect, a semiconductor device includes a semiconductor substrate of a first semiconductor material of a first type conductivity and having an energy band-gap to exhibit an optical response only at a characteristic optical wavelength corresponding to an energy equal to or greater than the energy band-gap, the semiconductor substrate structured to form nanowires from the semiconductor material on one side of the semiconductor substrate. The semiconductor device also includes a layer of a second semiconductor material of a second type conductivity formed over the nanowires as coated nanowires to form a p-n semiconductor junction at an interface between the first and second semiconductor materials at each coated nanowire to cause the coated nanowires to exhibit an optical response at a long optical wavelength corresponding to an energy less than the energy band-gap and longer than the characteristic optical wavelength. The semiconductor device additionally includes electrical contacts formed on the semiconductor substrate to apply an electrical bias to the p-n semiconductor junction at each coated nanowire to activate the optical response at the long optical wavelength.

In some implementations of the above semiconductor device, the first semiconductor material of the first type conductivity is a p-doped semiconductor and the second semiconductor material of the second type conductivity is a n-doped semiconductor.

In some implementations of the above semiconductor device, the first semiconductor material of the first type conductivity is a n-doped semiconductor and the second semiconductor material of the second type conductivity is a p-doped semiconductor.

In some implementations of the above semiconductor device, the first semiconductor material of the first type conductivity is a p-doped silicon and the second semiconductor material of the second type conductivity is a n-doped silicon.

In some implementations of the above semiconductor device, the first semiconductor material of the first type conductivity is a n-doped silicon and the second semiconductor material of the second type conductivity is a p-doped silicon.

In some implementations of the above semiconductor device, a dimension of each nanowire is selected to be greater than a selected value to maintain the first conductivity type against diffusion of carriers of the second conductivity type from the layer of the second semiconductor material of the second type conductivity.

In some implementations of the above semiconductor device, a dimension of each nanowire is selected to be greater than a selected value to maintain the first conductivity type against diffusion of carriers of the second conductivity type from the layer of the second semiconductor material, and wherein a ratio between a thickness of the layer of the second semiconductor material and the dimension of each nanowire is greater than a first value and is smaller than a second value to enhance a strength of the optical response at the long optical wavelength.

In some implementations of the above semiconductor device, material compositions of the first and second semiconductor materials, and the dimensions of both the nanowires of the first semiconductor material and the layer of the second semiconductor material are configured to enhance a strength of the optical response at the long optical wavelength.

In some implementations of the above semiconductor device, material compositions of the first and second semiconductor materials, and the dimensions of both the nanowires of the first semiconductor material and the layer of the second semiconductor material are configured to effectuate a Franz-Keldysh effect, a quasi-quantum confinement effect, and an impurity-state assisted photon absorption in the covered nanowires to enhance a strength of the optical response at the long optical wavelength.

In some implementations, the above semiconductor device also includes a device circuit coupled to the electrical contacts to control the covered nanowires to exhibit optical absorption at the long optical wavelength.

In some implementations of the above semiconductor device, the first and second semiconductor materials are doped Si materials and the long optical wavelength is in a spectral range longer than 1.15 micron.

In some implementations, the above semiconductor device also includes a device circuit coupled to the electrical contacts to control the covered nanowires to exhibit optical emission at the long optical wavelength.

In some implementations of the above semiconductor device, the covered nanowires effectuate a light emitting diode to produce incoherent light at the long optical wavelength.

In some implementations of the above semiconductor device, the covered nanowires effectuate a semiconductor laser to produce coherent light at the long optical wavelength In some implementations, the above semiconductor device also includes a device circuit coupled to the electrical contacts to control the covered nanowires to exhibit optical absorption at the long optical wavelength and to a photon-induced electrical signal as a photovoltaic device.

These and other aspects, their implementations and advantages are described in greater detail in the drawings, the description and the claims.

BRIEF DESCRIPTION OF DRAWINGS

Like reference symbols and designations in the various drawings indicate like elements.

DETAILED DESCRIPTION

Figure 1:
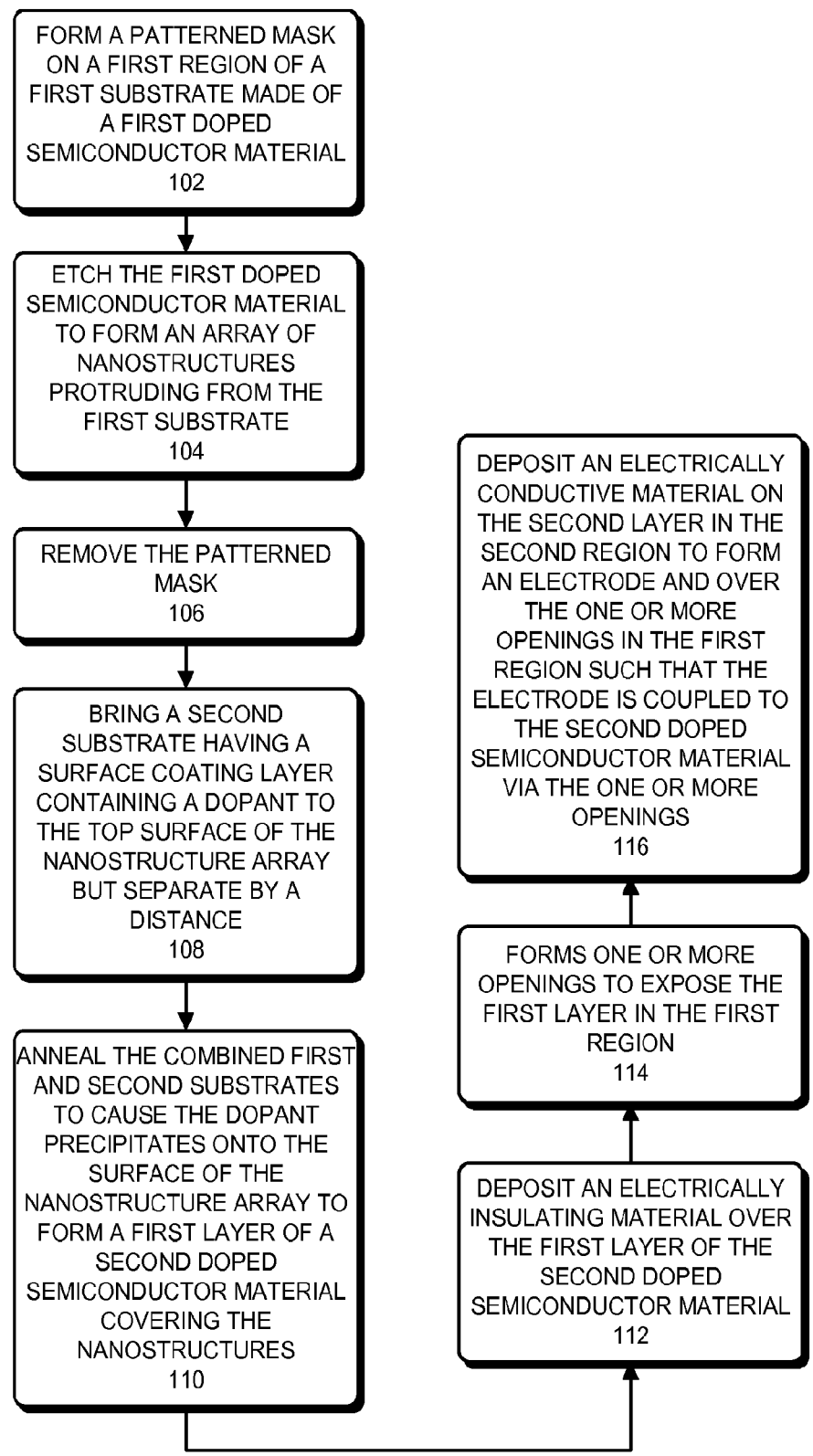
FIG. 1 presents a flowcharting illustrating the photodetector fabrication process in accordance with some embodiments described herein.

Silicon nanostructures have unique optical properties that cannot be observed in their bulk counterparts. In particular, silicon can be used to fabricate various nanoscale photonic devices, such as high speed optical modulators, low loss waveguides, and even laser sources.

Because silicon (Si) has intrinsically very low response to photons with energies below its bandgap (e.g., infrared photons with λ>1.15 μm), special techniques including heterogeneous integration, wafer bonding, and defect or interfacial states absorption have been investigated to extend light detection of Si photonic circuits to communication wavelengths. Other than heteroepitaxial growth (e.g., Ge on Si) and heterointegration using wafer bonding (e.g., InP on Si), the Si community continues to seek low cost, fully complementary metal-oxide-semiconductor (CMOS) compatible optical detection techniques. Most attempts of achieving "all-Si" near infrared wavelength optical detection have used defect states at the interface or in the bulk crystal. These defect states may be introduced by ion implantation, Si-dielectric interface, or Si-metal interface. However, detectors using defect or surface states tend to produce inconsistent results which are difficult to reproduce. Therefore, it can be challenging to use silicon as an active absorbing material for infrared photodetection. In order to realize all-silicon CMOS-compatible infrared photodetectors, various approaches have been investigated, which include incorporation of germanium with silicon as the optically responsive element; two photon absorption (TPA) process; and surface-plasmon Schottky detectors. However, in the case of SiGe devices, the success of the development is tempered by the material growth as well as the waveguide integration issues, especially when the devices are in nanoscale. On the other hand, both surface-plasmon enhanced mechanism and two-photon absorption process require a high photon density in a small interaction region and are sensitive to loss. As a result, complex fabrication techniques are typically involved in the realization of specific plasmonic structures or high Q-cavities. For example, pure p-type silicon nanowires can be used for infrared photodetection at cryogenic temperature, e.g., where a phototransistive gain mechanism resulting from the band to surface state absorption is utilized. However, such mechanisms involving surface states are subject to the generation-recombination noise and have slow frequency response limited by the deep levels.

The technology described in this document can be used to provide various semiconductor microstructures and nanostructures that exhibit voltage dependence of photoresponse (also referred to as "optical response" throughout) to both near bandgap and infrared sub-bandgap optical radiations. Specifically, the disclosed technology can be used to achieve enhanced sub-bandgap optical absorption of silicon using either vertical core-shell silicon nanowires or waveguide-coupled silicon homojunction structures.

In some implementations of the disclosed technology, a semiconductor device to detect light (e.g., including a photoresponse to sub-bandgap photons) includes a p-n junction structure formed of a semiconductor material, wherein the p-n junction structure is configured such that at least one type of carriers (e.g., electrons or holes) is spatially confined to a regime less than 1000 nm in at least one dimension of the device (e.g., the direction perpendicular to the p-n junction interface). Moreover, at least one side of the p-n junction (e.g., p-side or n-side) is heavily doped (e.g., doping concentration $>1\times10^{18}$ cm$^{-3}$). The semiconductor device also includes electrical contacts formed on a semiconductor substrate (which supports the semiconductor device) to apply an electrical bias to the p-n junction to activate the optical response at target optical wavelength corresponds to an energy substantially equal to or less than the energy band-gap of the first semiconductor material. In some embodiments, at least part of the light energy being detected presides the area around the metallurgical junction. In particular embodiments, the semiconductor material is silicon.

The exemplary semiconductor device implements p-n junction structure configurations that can effectuate a Franz-Keldysh effect, a quasi-quantum confinement effect, and an impurity-state assisted photon absorption in the p-n junction structure to enhance the optical response of the semiconductor device at the target optical wavelength. Such p-n junction structure configurations can include, but are not limited to the spatial confinement in at least one dimension of the p-n junction structure and the high doping level in at least one-side of the p-n junction structure.

In some implementations, a photodetector device utilizes a p-n junction structure configuration in the form of nanowire. A nanowire photodetector device can include a substrate formed of a first doped semiconductor material, the substrate including a first region and a second region, an array of multilayered nanowire structures protruding from the first region of the substrate, in which the nanowire structures are formed of the first doped semiconductor material covered by a first layer of a second doped semiconductor material to form core-shell nanowire structures. The first layer of the core-shell nanowire structures are covered by an insulating layer to provide electrical isolation of the nanowire structures. Electrodes are formed in the second region of the substrate and coupled to the first layer of the array of multilayered nanowire structures. Hence, the multilayered nanowire structures in the first region function as an optical active region capable of detecting infrared sub-bandgap optical radiation that generates an electrical signal presented at the electrode.

In some implementations, a semiconductor device can include a semiconductor substrate made of a first semiconductor material of a first type conductivity and having an energy band-gap to exhibit an optical response only at a characteristic optical wavelength corresponding to an energy equal to or greater than the energy band-gap. The photodetector device also includes a semiconductor multilayer structure of the first semiconductor material fabricated on the semiconductor substrate. One or more layers of a second semiconductor material of a second type conductivity are formed over the semiconductor multilayer structure to form a p-n junction structure which exhibits an optical response at a long optical wavelength corresponding to an energy less than the energy band-gap and longer than the characteristic optical wavelength. The photodetector device also includes electrical contacts formed on the semiconductor substrate to apply an electrical bias to the p-n junction structure to activate the optical response at the long optical wavelength.

Some embodiments described in this disclosure provide a vertically-aligned silicon nanowire-based device that exhibits voltage dependence of photoresponse to infrared sub-bandgap optical radiation. The exemplary device can be fabricated using a proximity solid-state phosphorous diffusion method to convert the surface areas of highly boron-doped p-type silicon nanowires into n-type semiconductor, thus forming a radial core-shell p-n junction structure. Significant photoresponse from such core-shell Si nanowires can be observed under sub-bandgap illumination conditions (e.g., 1310 nm). Such photoresponse can be highly dependent on a bias voltage of the device. This strong bias dependence and other device characteristics indicate that the sub-bandgap absorption is attributed to the intrinsic properties of core-shell Si nanowires rather than the surface states. While the above example is directed to fabricating p-core/n-shell Si nanowires, other implementations can fabricate n-core/p-shell Si nanowires, for example, by converting the surface areas of highly doped n-type silicon nanowires into p-type silicon.

Some embodiments described in this disclosure also provide a silicon epitaxial p-n junction-based device that exhibits voltage dependence of photoresponse to both near bandgap and infrared sub-bandgap optical radiations. The device can include a heavily doped, abrupt epitaxial p-n junction structure that has a strong spatial confinement in the junction axis. Such device demonstrates significant optical absorption under sub-bandgap illumination (e.g., 1310 nm) without relying on material defects or surface states or using any silicon nanowire structure.

The unique characteristics of the disclosed core-shell p-n junction structure and the epitaxial p-n junction structure may be explained based on three physical mechanisms: the Franz-Keldysh effect, quasi-quantum confinement effect, and the impurity-state assisted photon absorption. The first two effects enhance carrier tunneling probability, rendering a stronger wavefunction overlap to facilitate sub-bandgap absorption. The third effect relaxes the k-selection rule by involving the localized impurity states, thus removing the limit imposed by the indirect bandgap nature of silicon.

More specifically, a strong bias voltage applied to the core-shell p-n junction structure or the epitaxial p-n junction structure effectuates the Franz-Keldysh effect: the wavefunctions of the carriers tunnel into higher energy regions beyond the classical reflection point, thus allowing interactions with the electromagnetic radiations (i.e., photons) at energies lower than the bandgap. To further enhance this typically weak Franz-Keldysh effect, the disclosed core-shell nanowire structure and the epitaxial p-n junction structure provide spatial confinement to the spread of the electron wavefunctions, thus increasing the probability for electrons to tunnel through the energy barrier. Moreover, to cope with the issue of indirect bandgap of silicon that requires phonons to satisfy the momentum conservation, a high doping concentration within at least one side of the disclosed p-n junction structures introduces abundant localized impurity states into the device structures. Because the impurity states are typically highly localized, the uncertainty in k-space may be augmented according to the uncertainty principle. The probability for optical absorption may be drastically enhanced when the uncertainty in k-space reaches the difference between the conduction band minimum and the valence band maximum.

Some disclosed devices can use single-crystal silicon and have the potential for fabricating microphotonic and nano-photonic systems in a fully CMOS compatible process. The disclosed systems, devices, and techniques can use the intrinsic properties of single-crystalline silicon for sub-bandgap photodetection, thus extending the operable spectrum of silicon to regimes of interest associated with optical communications (e.g., 1310 nm). Moreover, the disclosed techniques, devices and system can be applied to not only silicon but other materials to significantly extend the operable wavelength regime of these materials beyond the constraint of energy bandgap.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made.

In some embodiments, a photodetector device responsive to infrared sub-bandgap optical radiation and the techniques for fabricating such a devise are disclosed. FIG. 1 presents a flowcharting illustrating the photodetector fabrication process in accordance with some embodiments described herein. The fabrication process can start by forming a patterned mask on a first region of a first substrate made of a first doped semiconductor material (step 102). In one embodiment, the first doped semiconductor material is a p-type silicon. After step 102, the patterned mask partially covers the surface of the first region of the first substrate while exposing the surface in an array of selected regions to be removed by etching. Next, the process etches the first doped semiconductor material from the array of selected regions of the first substrate to form an array of nanostructures protruding from the first substrate (step 104). The pattern mask is then removed from the nanostructure array (step 106). Next, a second substrate having a surface coating layer containing a dopant is brought into a proximity of the first substrate, while the top surface of the nanostructure array is substantially separated from the dopant-coated surface of the second substrate by a distance (step 108). Next, the process anneals the combined first and second substrates to cause the dopant evaporates from the second substrate and precipitates onto the surface of the nanostructure array to form a first layer of a second doped semiconductor material covering the nanostructures in the first region (step 110). In one embodiment, the second doped semiconductor material is an n-type silicon.

The process then deposits an electrically insulating material over the first layer of the second doped semiconductor material to form a second layer covering the nanostructures in the first region and over the surface of a second region of the first substrate (step 112). Next, the process forms one or more openings to expose the first layer in the first region (step 114). The process next deposits an electrically conductive material on the second layer in the second region to form an electrode and over the one or more openings in the first region such that the electrode is coupled to the second doped semiconductor material via the one or more openings (step 116). Hence, the process produces a photodetector device which is capable of detecting infrared sub-bandgap optical radiation wherein the generated electrical signal may be detected at the electrode.

Figure 2:
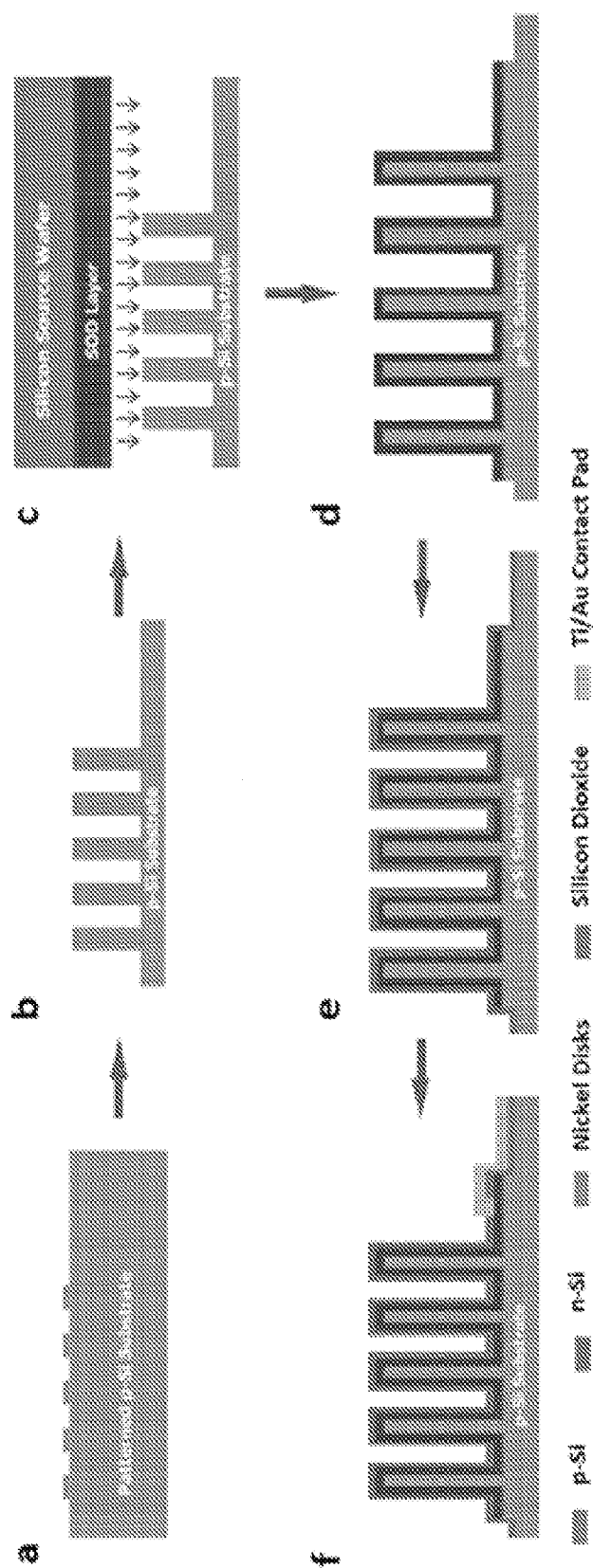
FIG. 2 illustrates a schematic of the described fabrication process to realize a device that can facilitate sub-bandgap optical absorption in accordance with some embodiments described herein.

FIG. 2 illustrates a schematic of the described fabrication process to realize a device that can facilitate sub-bandgap optical absorption in accordance with some embodiments described herein. The device, which comprises a vertically-aligned 2-D array of p-core/n-shell silicon nanowires structure, may effectively incorporate all three aforementioned physical mechanisms. As shown in FIG. 2, the device may be fabricated starting from a p+-Si wafer which has an electron-beam lithography patterned nickel-disk arrays on top as etch mask (step a). Next, a p+-nanowire array is formed using ICP-RIE dry etch process, and the nickel mask is subsequently removed (step b). Next, a proximity diffusion process is used to create the core-shell nanowire structures. More specifically, a second silicon wafer covered with a spin-on-dopant (SOD) layer is brought in close proximity to the nanowire arrays (step c). By annealing the combined first and second substrates, the dopant evaporates from SOD layer and precipitates and diffuses into the nanostructures to form an n-type shell layer covering the p-type cores of the nanostructures (step d). After forming the core-shell structures, an etch step may be performed between groups of core-shell structures to achieve electrical isolation between adjacent nanowire arrays (step d). Next, a $SiO_2$ layer is deposited over the device structures as a device insulating layer (step e), which is followed by the deposition of electrically conductive contact pads, e.g., Ti/Au contact pads (step f).

As an example, a p-core/n-shell silicon nanostructure device is fabricated as follows. A boron-doped p+-Si wafer with a doping concentration ~$10^{19}$ $cm^{-3}$ is used to create the nanowires with a height of 2.5 μm by anisotropical etching the wafer using the ICP-RIE process with C4F8 and SF6 gases. After the formation of p+-nanowires, the nickel disks are removed using the standard Ni etchant. A phosphorous-containing spin-on-dopant (SOD) solution (from Filmtronics, Inc.) is spin-coated on a separate silicon wafer at 4000 rpm for 10 seconds, followed by baking at 200° C. for 15 minutes. The SOD-coated wafer is then placed as a dopant source above the wafer with nanowire structures. The two wafers are separated by a distance of around 1 mm using quartz spacers and loaded into a rapid-thermal-annealing (RTA) furnace. The diffusion is then carried out at 950° C. for 35 seconds, during which the phosphorous atoms evaporate from the source wafer and precipitate on and diffuse into the nanowires. After the diffusion process, a diluted HF solution is used to remove the SOD residues on the nanowires. To achieve electrical isolation between nanowire arrays, another dry etch step using $SiO_2$~1 μm as an etch mask is performed to create 320 nm high mesa structures spanning 35 μm×46 μm each. There are a total of 900 nanowires in a 30×30 array (1 μm in pitch) on each device mesa. The $SiO_2$ mask is removed after the mesa etch, and another layer of $SiO_2$~250 nm is deposited and patterned lithographically for the n-contact windows. The p-contact is on the backside of the substrate and shared by all the devices on the wafer. Finally, Ti/Au contact pads are deposited through the n-contact windows away from the optical active regions.

Figure 3:
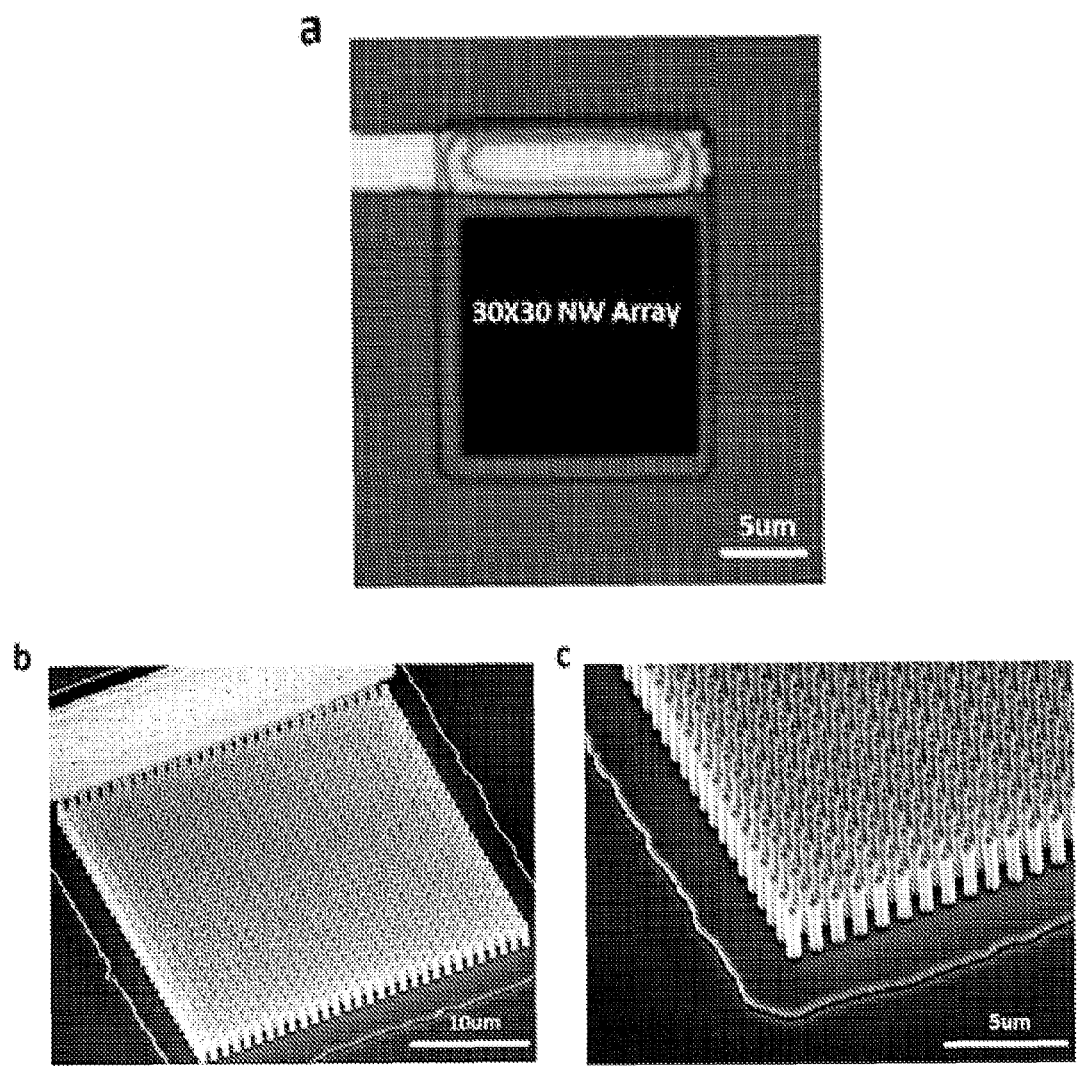
FIG. 3 shows optical and SEM images of a fabricated 30×30 nanowire-array device in accordance with some embodiments described herein.

FIG. 3 shows optical and SEM images of a fabricated 30×30 nanowire-array device in accordance with some embodiments described herein. The nanowires in the images have a diameter of 340 nm and a height of 2.5 μm, with a pitch of 1 μm. More specifically, subplot (a) shows the bright-field optical microscopic image of the device using a 50× objective lens and N.A.=0.7. Note that the nanowire area appears to be darker than the surrounding Si area, suggesting the effect of photon trapping. For comparisons of device characteristics, planar devices of the same sized mesa without the nanowire array are also fabricated. Subplot (b) in FIG. 3 is an SEM image of the same device showing nanowires standing on a mesa and next to the Ti/Au metal finger. Further, subplot (c) in FIG. 3 is the zoomed-in view of the nanowires near the edge of the mesa.

Figure 4A:
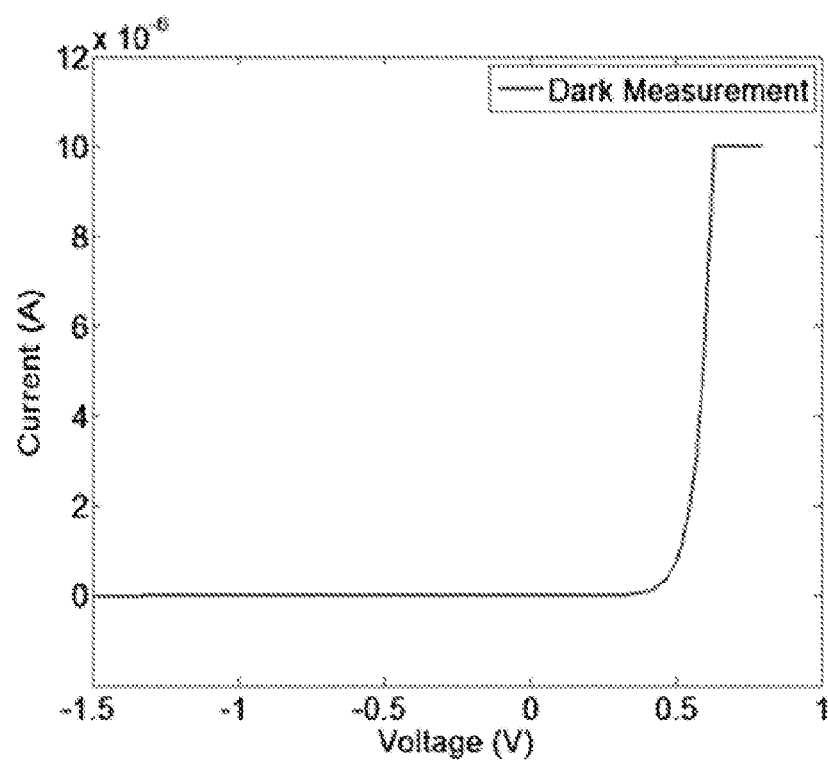
FIG. 4A shows a data plot of the dark I-V characteristics (in linear scale) of the fabricated core-shell nanowire device in accordance with some embodiments described herein.

FIG. 4 shows the dark I-V characteristics of a 340 nm-diameter core-shell nanowire device fabricated using the aforementioned processes. More specifically, FIG. 4A shows a data plot of the dark I-V characteristics (in linear scale) of the fabricated core-shell nanowire device in accordance with some embodiments described herein. A typical rectifying behavior of p-n junctions can be observed. The flat line at bias higher than 0.8 V may be due to the current compliance setting ($I_{max}$=10 μA) for device protection.

Figure 4B:
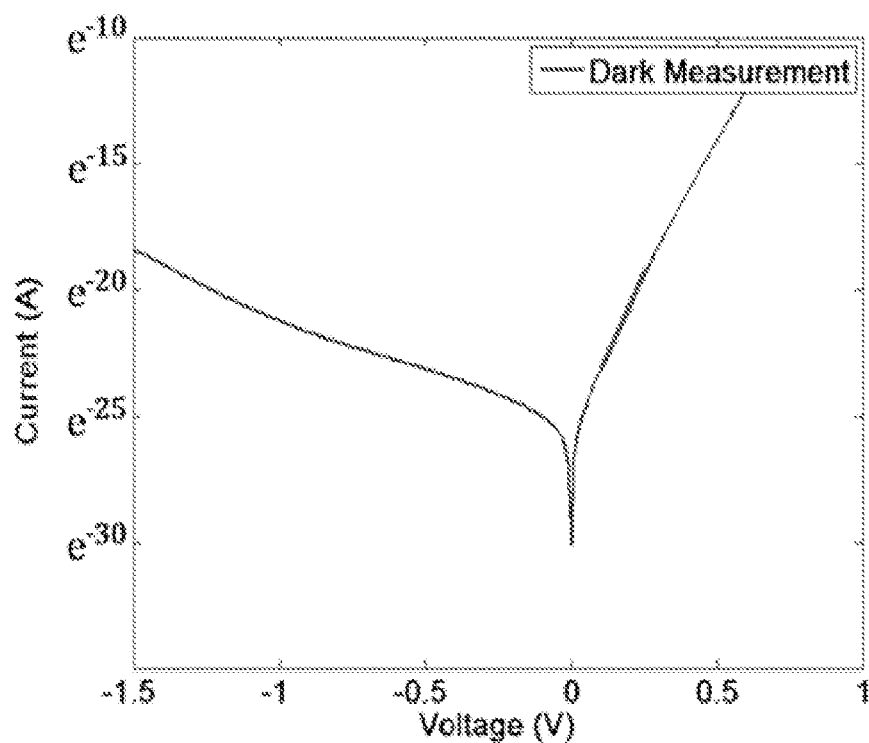
FIG. 4B shows a log scale plot of the dark I-V characteristics with linear fit (red solid line) for extraction of the ideality factor.

FIG. 4B shows a log scale plot of the dark I-V characteristics with linear fit (red solid line) for extraction of the ideality factor. By fitting the forward bias regime using the Shockley's diode equation, an ideality factor of ~1.71 can be obtained. In the reverse bias region, the dark current is 10.5 nA under 1.5 V reverse bias. A slightly faster increase in dark current at reverse bias greater than 1.0 V may be caused by the increase of the depletion width where most dark current contributing carriers are generated by thermal excitation. Moreover, similar devices with smaller nanowire diameters also exhibit lower dark current values, for example, 6.9 nA for 240 nm-diameter nanowires at 1.5 V reverse bias. The typical I-V characteristics of p-n junctions displayed in FIGS. 4A and 4B demonstrate the successful fabrication of radial core/shell Si nanowires using the proximity diffusion technique described above.

Figure 5A:
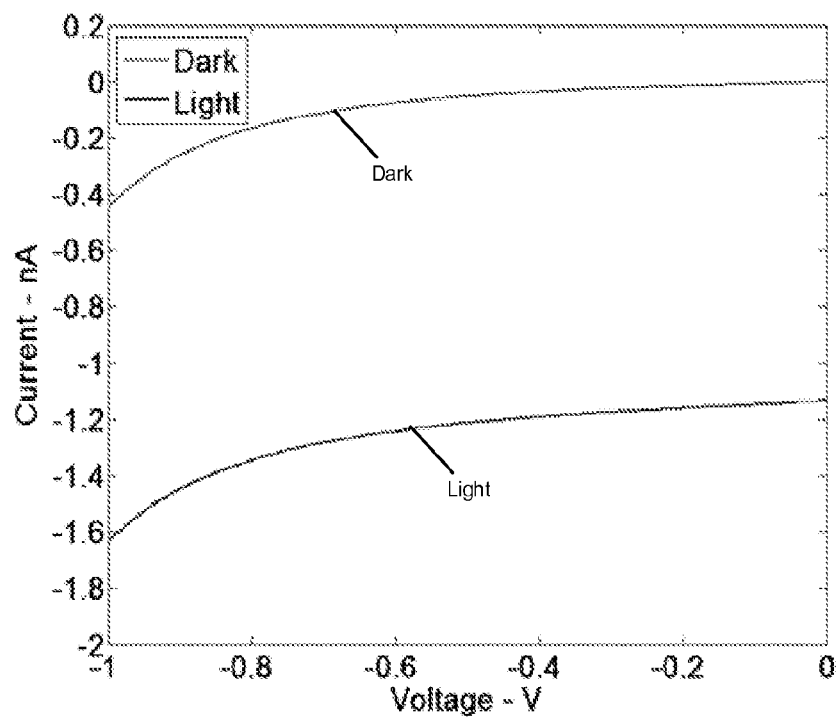
FIG. 5A shows both dark and light I-V curves of the core-shell Si nanowires measured at 1054 nm wavelength.
Figure 5B:
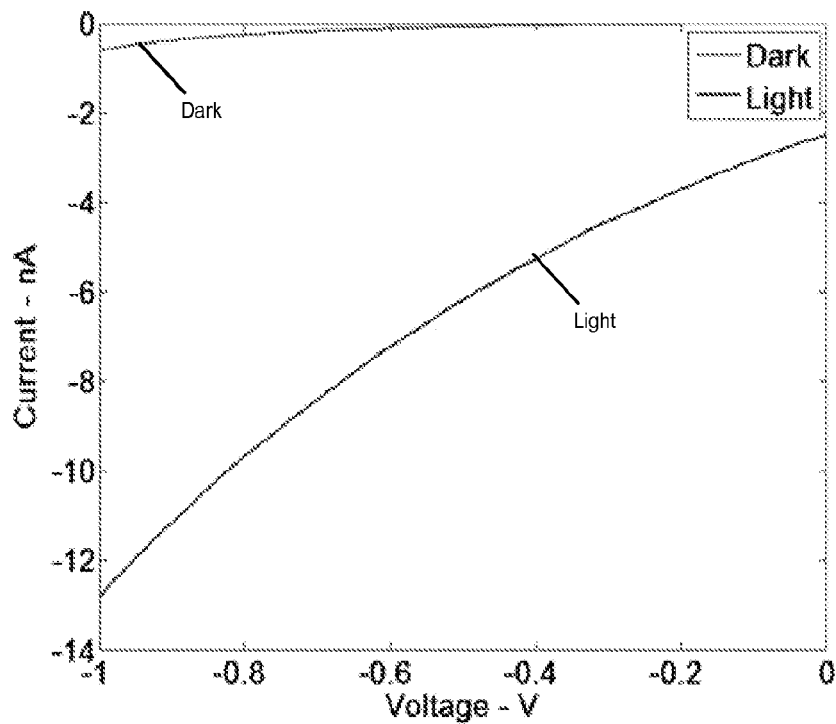
FIG. 5B shows both dark and light I-V curves of the core-shell Si nanowires measured at 1310 nm wavelength.

In some implementations, the devices are tested for their infrared (IR) characteristics using 1054 nm and 1310 nm laser sources. The photon energy of 1054 nm light is slightly above the bandgap energy of Si at room temperature, while the photon energy of 1310 nm light is well below the bandgap of silicon. FIGS. 5A and 5B show the measured I-V curves of the core-shell Si nanowires in the reverse bias region for optical signals at 1054 nm and 1310 nm, respectively. More specifically, FIG. 5A shows both dark and light I-V curves measured at 1054 nm wavelength, while FIG. 5B shows both dark and light I-V curves measured at 1310 nm wavelength. Strong noticeable differences in voltage-dependent behaviors of photoresponse at these two wavelengths can be observed. Shown in FIG. 5B, the photoresponse increases rapidly with the reverse bias voltage for sub-bandgap (1310 nm) photons. Such phenomenon is not observed when the excitation wavelength (e.g. 1054 nm) is slightly above the bandgap energy. Based on the model to be discussed, such large differences in voltage-dependent photoresponses may be directly resulted from the disclosed design which incorporate the three aforementioned physical mechanisms.

In some embodiments, comparisons between a conventional planar device without nanowires and a device with nanowires are made under the same measurement conditions. Although previous studies have shown that nanowire arrays exhibit enhanced absorption at visible and UV wavelengths due to the waveguiding effects caused by the large index difference between semiconductor nanowires and materials between nanowires, optical simulations show that such waveguiding effects have negligible influence on nanowires that are only 2.5 μm high at 1310 nm.

Figure 6A:
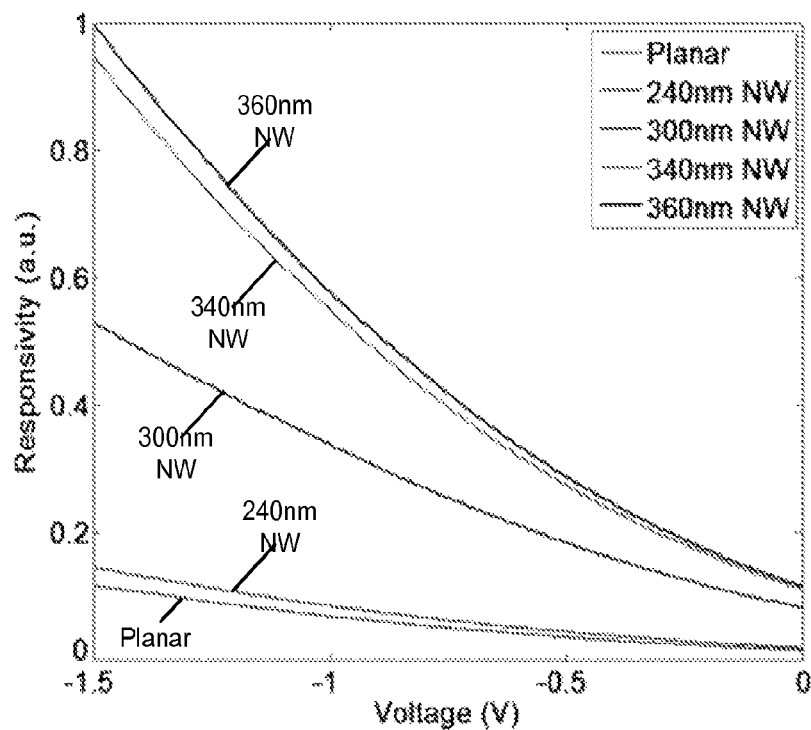
FIG. 6A shows a plot of the measured voltage-dependent photo-responsivities of both the conventional planar device and the nanowire devices with different diameters in accordance with some embodiments described herein.
Figure 6B:
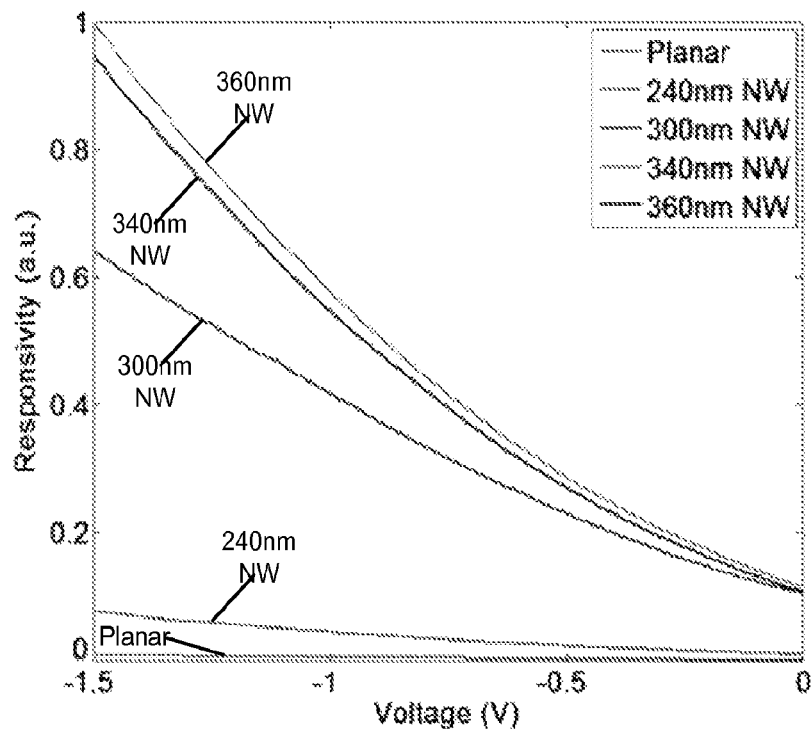
FIG. 6B shows a plot of the calibrated results which represent the true photo-responsivities of nanowires with various dimensions and the planar structure in accordance with some embodiments described herein.

FIG. 6A shows a plot of the measured voltage-dependent photo-responsivities of both the conventional planar device and the nanowire devices with different diameters in accordance with some embodiments described herein. Because the nanowire devices have a very low fill factor in the disclosed design and the waveguiding effect may be negligible for reasons discussed above, a correction of the data in FIG. 6A to find the actual contributions from the core-shell nanowires can be made. FIG. 6B shows a plot of the calibrated results which represent the true photo-responsivities of nanowires with various dimensions and the planar structure in accordance with some embodiments described herein. The calibration technique used to obtain data in FIG. 6B is described below.

The following procedure is used to calculate the true nanowire photo-responsivities from the raw data presented in FIG. 6A. It is assumed that over the mesa area that contains a nanowire array (see FIG. 3), the net photoresponse is the sum of the response of the nanowires and that of the planar area not covered by the nanowires (including those areas between the nanowires). We define $R_{NW}$ as the photo-responsivity of nanowires, $R_{PlanarM}$ as the photo-responsivity of the planar structure, and $R_M$ as the measured photo-responsivity from the device that contains both nanowires and planar area. Assume A is the total optically active area over the mesa and $a=30 \times 30 \times \pi \times (d/2)^2$ is the area occupied by the 30×30 nanowire array, where d is the diameter of the core-shell nanowire (equals to 240, 300, 340, and 360 nm). The actual photo-responsivity of the nanowires $R_{NW}$ can then be extracted from the measured results of $R_{PlanarM}$ and $R_M$ in FIG. 6A and expressed as:

$$R_{NW} = (R_M - R_{PlanarM}) \times \frac{A}{a} + R_{PlanarM} \quad (1)$$

The corrected values of $R_{NW}$ are shown in FIG. 6B. According to the data shown in FIG. 6B, the sub-bandgap photo-responsivity at 1310 nm of core-shell nanowires is nearly two orders of magnitude stronger than that of the conventional planar structure. The infrared responsivity of core-shell nanowires also shows strong bias dependence. In some exemplary devices, nanowires having larger diameters exhibit greater photoresponses, and nanowires having diameters less than 240 nm do not show p-n junction characteristics, which may indicate that the entire p-doped core is turned into n-type due to the phosphorous diffusion. Moreover, the responsivity of the 360 nm-diameter nanowire is slightly lower than the responsivity of the 340 nm devices, which suggests that there exists an optimal core/shell thickness relation that gives rise to the highest sub-bandgap photoresponse.

The following sections describe the detailed physical model for the device by mathematically formulating the physical mechanisms that are dominant for sub-bandgap light absorption: the Franz-Keldysh effect and quasi-quantum confinement effect in real space, and the impurity-state assisted photon absorption in k-space.

Figures 7A, 7B:
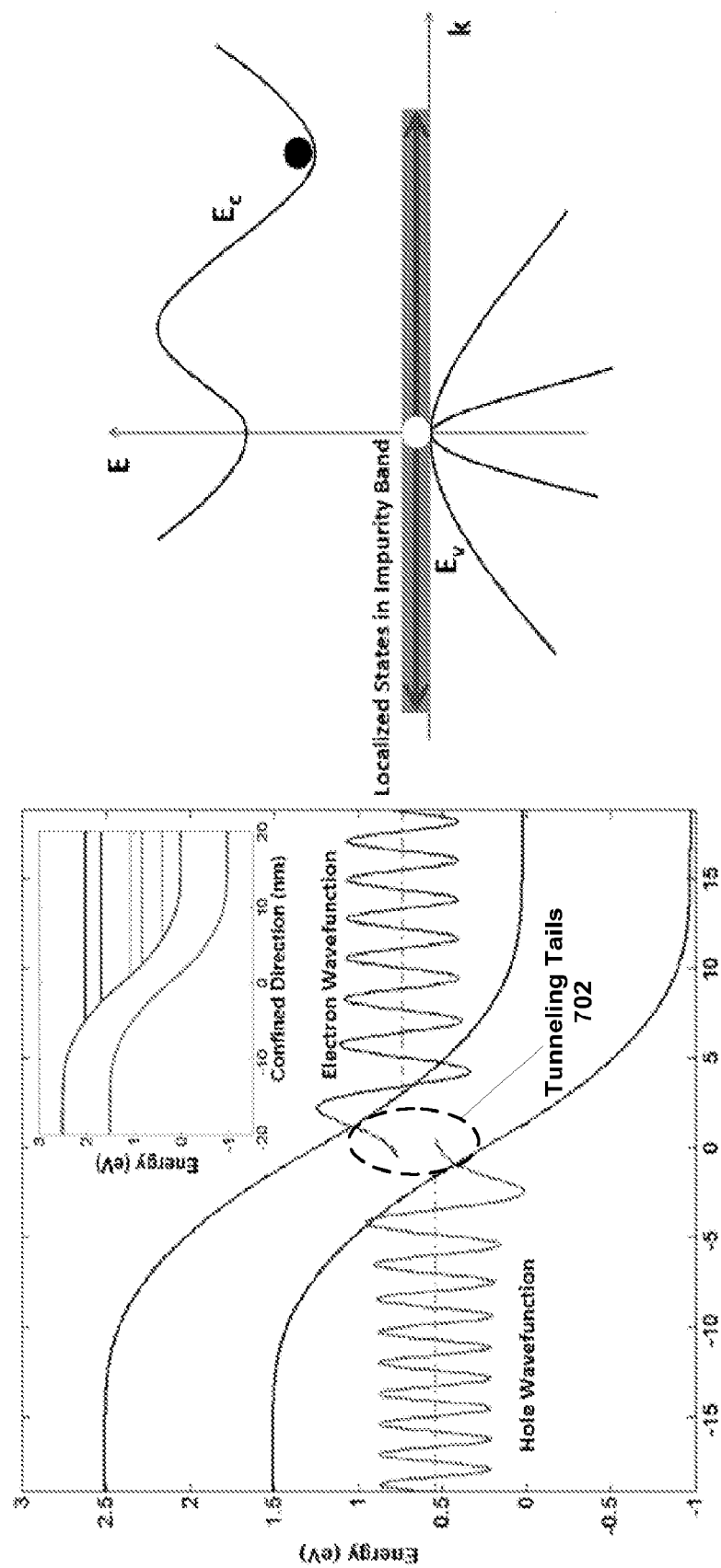
FIG. 7A shows a data plot of the Franz-Keldysh effect that gives rise to electron-hole (e-h) wavefunction overlap within the bandgap of silicon.
FIG. 7B shows a 1-D schematic of an impurity band formed as a result of using highly boron-doped silicon.

FIG. 7 shows plots and schematics of the physical mechanisms involved in sub-bandgap photon absorption displayed in the disclosed core-shell Si nanowire devices. More specifically, FIG. 7A shows a data plot of the Franz-Keldysh effect that gives rise to electron-hole (e-h) wavefunction overlap within the bandgap of silicon. Under a high electric field caused mainly by a reverse bias voltage across the p-n junction, the edges of conduction band and valence band are tilted along the direction of the electric field. As a result, the electron and hole wavefunctions possess the characteristics of Airy functions, having a "tail" that extends into the classically-forbidden bandgap regime. Because the absorption coefficient is proportional to the magnitude square of the overlap integral of the e-h wavefunctions, the presence of the tunneling tails (e.g., tunneling tails 702 in FIG. 7A), significantly enhances the e-h wavefunction interactions with sub-bandgap photons. Hence, by applying a sufficiently high reverse bias voltage on the radial core-shell p-n junc-tion in silicon nanowires, a high built-in electric field (e.g., $E > 10^{5-6}$ V/cm) can be created within the p-n junction to induce the above-stated Franz-Keldysh effect.

Quantum confinement may also play an important role in the core-shell nanowire structure because the electrons in the shell region are spatially confined in the radial direction. The boundary conditions arising from the nanowire geometry force the electron wavefunctions to decay rapidly near the nanowire surface, thus increasing the probability for electrons to reach the regions near the p-n junction for enhanced value of the overlap integral between the electron and hole wavefunctions. We refer to the effect as "quasi-quantum confinement" because the dimension of concern (e.g., ~50-100 nm) is greater than the dimension of conventional quantum wells (~10 nm). Note that this quasi-quantum confinement may provide spatial confinement of electron wavefunctions to maximize the wavefunction overlap integral. Moreover, the quasi-quantum confinement can produce discrete electron sub-bands of discrete energy levels. For example, the inset of FIG. 7A shows a plot of the presence of discrete electron sub-bands energy levels due to quantum confinement. Note that the number of sub-bands increases with the bias voltage due to the increase in the confinement energy.

In addition to the Franz-Keldysh effect and the quasi-quantum confinement that maximize the e-h wavefunction interactions associated with sub-bandgap photons, in some implementations, highly doped silicon can also be used to create a large number of impurity states to relax the k-selection rule in momentum space. More specifically, when the average distance between the impurity atoms approaches the atomic orbital radius, an impurity band is formed above the valence band edge for p+ silicon. FIG. 7B shows a 1-D schematic of an impurity band formed as a result of using highly boron-doped silicon. Because of the uncertainty principle, the mobility of the carriers in the impurity band is nearly zero, suggesting that holes in the impurity band have highly localized wavefunctions without a well-defined crystal momentum in k-space. As a result, the k-selection rule can be significantly relaxed if the optical excitation involves the impurity states. Consequently, the impurity band creates a condition that favors optical transition for indirect bandgap semiconductors such as silicon. The following sections describe a model for optical transitions between confined electrons and holes in the localized impurity states for a core-shell p+/n Si nanowire structure under a reverse bias condition.

Figure 8A:
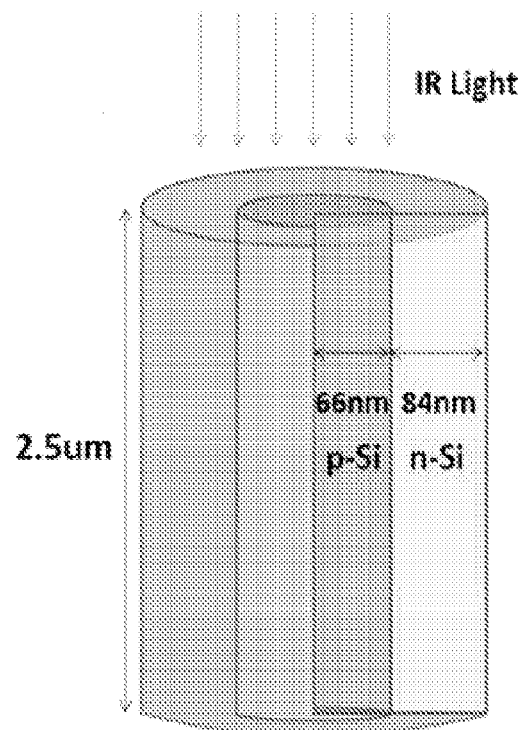
FIG. 8A shows a diagram of the simulated structure and the range of p-core and n-shell, respectively.

FIG. 8 shows diagrams and plots of numerical simulation of the fabricated core-shell silicon nanowire. More specifically, FIG. 8A shows a diagram of the simulated structure and the range of p-core and n-shell respectively. The simulation considers a 300 nm-diameter nanowire structure with a height of 2.5 μm. As illustrated in FIG. 8A, the core-shell p+/n Si nanowire has an inner core of 66 nm radius and the shell of 84 nm in thickness. Because the core-shell structure is formed by the rapid thermal diffusion, the p-type doping concentration of the core is assumed to be equal to the concentration of the p-substrate ($10^{19}$ cm$^{-3}$), and the effective n-shell doping concentration used in the simulation is assumed to be $2 \times 10^{17}$ cm$^{-3}$. Note that although the actual impurity level of the n-shell should be rather high to overcompensate the background doping of the p-Si, the surface states pin the Fermi-level and trap most of the electrons to the surface states, leaving an effective electron concentration to be around $2 \times 10^{17}$ cm$^{-3}$.

Figure 8B:
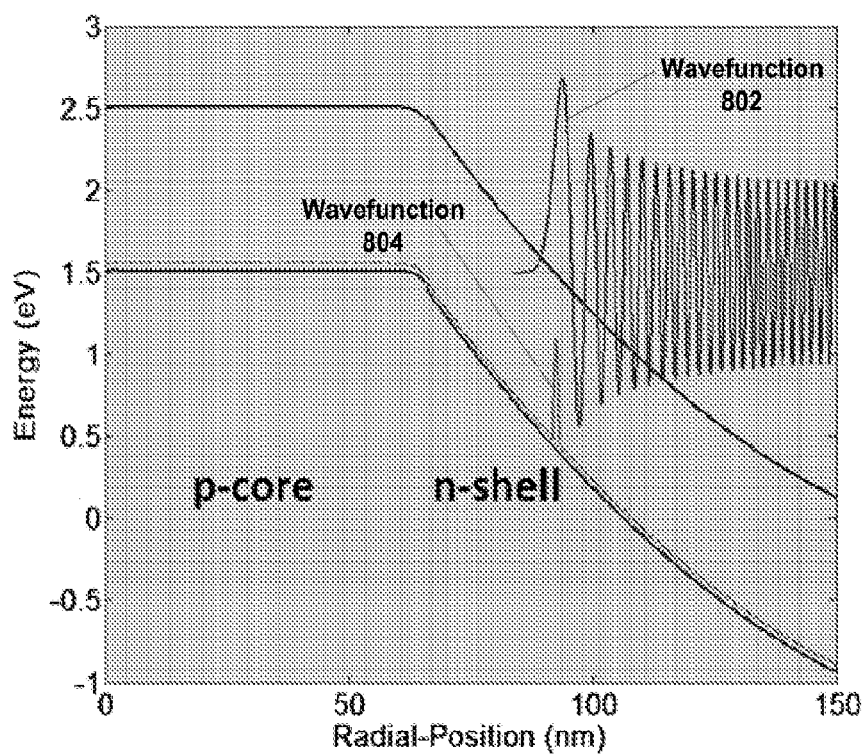
FIG. 8B shows a plot of the concept of sub-bandgap photon absorption illustrating the interaction between a confined electron wavefunction and a localized impurity state wavefunction.

As described above, the sub-bandgap photon absorption originates from the interactions between the wavefunction of electrons in the n-Si and the wavefunction of impurity states (i.e., holes). FIG. 8B shows a plot of the concept of sub-bandgap photon absorption illustrating the interaction between a confined electron wavefunction (802) and a localized impurity state wavefunction (804). The simulation starts with the calculations of the overlap integral of wavefunctions between the impurity states and electrons using one-dimensional approximations as if we take a radial slice of the core-shell structure. The absorption coefficient of the structure can be calculated using the Fermi's Golden Rule from the time-dependent perturbation theory. The transition rate for absorption between an initial impurity state $|\Psi_h\rangle$ in the impurity band with energy $E_h$ and a final state $|\Psi_e\rangle$ in the conduction band with energy $E_e$ can be written as:

$$w_{abs} = \frac{2\pi}{\hbar} |\langle \Psi_e | \hat{H}_{PO} | \Psi_h \rangle|^2 \delta(E_e - E_h - \hbar\omega) \tag{2}$$

Here, $\hat{H}_{PO}$ is the perturbing Hamiltonian induced by the electromagnetic field of incoming photons using the electric dipole approximation. $\delta(E_e - E_h - \hbar\omega)$ represents the energy conservation relation. The absorption coefficient $\alpha$ is the probability of absorption of a photon per unit length in the direction of light propagation (e.g., along the nanowires):

$$\alpha = \sum_n \sum_h \sum_e \frac{2\pi}{\hbar} |\langle \Psi_e | \hat{H}_{PO} | \Psi_h \rangle|^2 \delta(E_e - E_h - \hbar\omega) / \left(\frac{I}{\hbar\omega}\right) \tag{3}$$

where I is the optical power intensity upon the core-shell nanowire (power per unit area per second) and $I/\hbar\omega$ is the flux of incident photons upon the nanowires. The subscripts n, h, and e in Equation 3 stand for the summations over all the electron subband levels (n), all the states $|\Psi_e\rangle$ in each electron sub-band (e), and all the impurity states $|\Psi_h\rangle$ (h) considering a unit volume.

Because silicon is an indirect bandgap material and has six conduction band minima, x-axis is defined to be the confined direction in parallel with the E-field. Taking out the atomic wavefunction of electrons that are treated separately, the rest of the electron wavefunctions are represented as:

$$\Psi_e = \frac{e^{i(\vec{k}_{e\perp} - \vec{k}_{0\perp}) \cdot \vec{r}_\perp} \xi_{e,n}(x)}{\sqrt{V}} \text{ and } \Psi_e = \frac{e^{i(\vec{k}_{e\perp}) \cdot \vec{r}_\perp} \xi_{e,n}(x) e^{-ik_0 x}}{\sqrt{V}}$$

for states with four-fold degeneracy and two-fold degeneracy, respectively. Here $\xi_{e,n}(x)$ is the electron wavefunction associated with one specific subband energy level in the x-direction, and these wavefunctions are obtained from SILVACO simulation software using one-dimensional approximations. Also $\vec{k}_{0\perp} = (0, \pm k_0, 0)$ or $(0, 0, \pm k_0)$, and $$k_0 = \frac{1.7\pi}{a}$$

is the distance in k-space between the zone center and the conduction band minimum. Further, the hydrogen atom model (1 s state) is used to approximate the wavefunctions of shallow impurities. Because the impurity state is highly localized, the wavefunction can be written in the form of $\Psi_h = \eta(r, x_o) u_h(r)$, where $u_h(r)$ is the usual atomic wavefunction and $\eta(r, x_o)$ represents the spread of the impurity state in space with its physical location at $x_o$ (distance from the center of the p$^+$ core). For simplicity, we approximate $$\eta(x, y, z; x_o) = \frac{1}{(2a^*)^{3/2}}$$

if $|x - x_o| \leq a^*, |y| \leq a^*, |z| \leq a^*$, and $\eta(x,y,z; x_o) = 0$ elsewhere, defining $a^*$ as the Bohr radius calculated from the equation $$a^* = \frac{4\pi\epsilon\hbar^2}{m_h^* e^2}.$$

Also, we describe the impurity states to have a single ionization energy $\in = 0.045$ eV above the valence band edge. Moreover, due to the device geometry and the p-type doping concentration ($1 \times 10^{19}$ cm$^{-3}$), the distance between impurities along the x-direction can be approximated as ~4.7 nm and it is assumed that all the impurity states are equally spaced. With the aforementioned assumptions and through change of variables, we obtain the mathematical expressions of absorption coefficients for both 4-fold and 2-fold degeneracy conditions:

$$\alpha_{4-fold}(E) \cong \frac{e^2 m_e^* |M_b|^2}{\epsilon_o m_o^2 \hbar c \bar{n} E} \frac{1}{R} (2a^*)^3 \tag{4}$$

$$\int_{x_o(\text{over doped region})} [P(x_o)]^{\frac{4}{3}} \sum_n |\xi_{e,n}^*(x_o)|^2 (f_v - f_c) \frac{\sin^4[k_\perp a^*]}{[k_\perp a^*]^4} dx_o$$

$$\alpha_{2-fold}(E) \cong \frac{e^2 m_e^* |M_b|^2}{\epsilon_o m_o^2 \hbar c \bar{n} E} \frac{1}{R} (2a^*)^4 \left| \frac{2\sin(k_o a^*)}{k_o (2a^*)^{3/2}} \right|^2 \tag{5}$$

$$\int_{x_o(\text{over doped region})} [P(x_o)]^{\frac{4}{3}} \sum_n |\xi_{e,n}^*(x_o)|^2 (f_v - f_c) \frac{\sin^4[k_\perp a^*]}{[k_\perp a^*]^4} dx_o$$

In Equations 4 and 5, R is the radius of the nanowire, $f_c$, and $f_v$ are the Fermi functions for electrons and holes, and $|M_b|^2$ is the squared matrix element that depends only on the unit cell wavefunctions. The value of $|M_b|^2$ can be determined approximately by $|M_b|^2 = 1.33 m_0 E_g$ in a quantum confined system. $P(x_o)$ is the doping concentration of the p-Si core and $$k_\perp = \frac{\sqrt{2m_e^* \Delta E}}{\hbar},$$

where $\Delta E$ is the kinetic energy of an electron in a specific subband. Other parameters in Equations 4 and 5 have their usual meanings. From these two equations, the calculated absorption coefficient for the nanowire structure turns out to be 13.0 cm$^{-1}$ at 0 V and 68.2 cm$^{-1}$ at −1.5 V respectively.

Figure 9A:
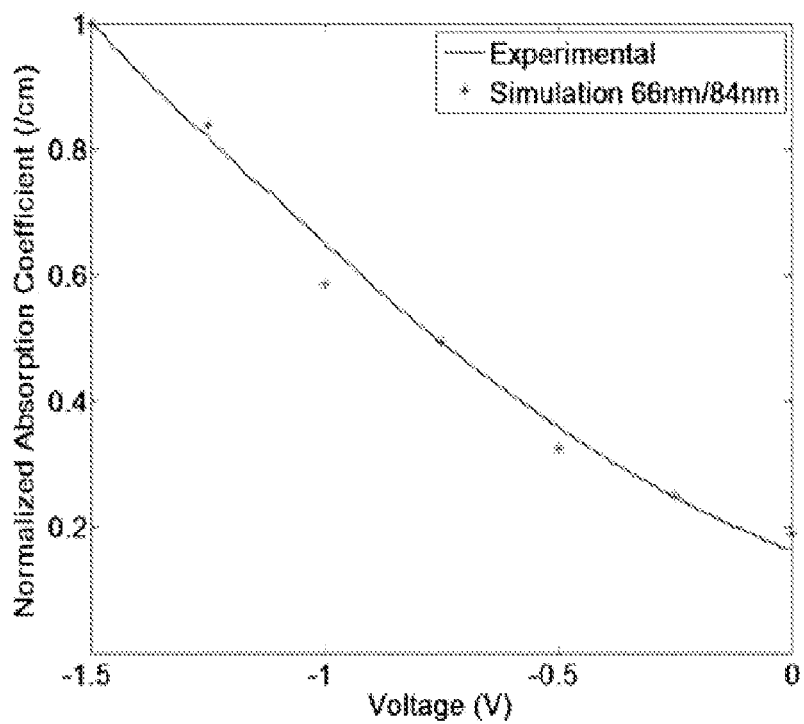
FIG. 9A shows data plots of comparisons between experimental data and simulation results of the 300 nm-diameter nanowires assuming the diffused p-n junction has a $1 \times 10^{19}/ 2 \times 10^{17}$ cm$^{-3}$ effective doping level and a core/shell radius of 66 nm/84 nm.

The voltage dependence of photoresponse exhibits an excellent agreement between the experimental data and the theoretical calculations. FIG. 9A shows data plots of comparisons between experimental data and simulation results of the 300 nm-diameter nanowires assuming the diffused p-n junction has a $1 \times 10^{19}/2 \times 10^{17}$ cm$^{-3}$ effective doping level and a core/shell radius of 66 nm/84 nm. The results in FIG.

9A are normalized because it is generally difficult to measure the exact value of absorption coefficient of core-shell nanowires precisely. Because the disclosed physical model contains no fitting parameter, the good agreement with the experimental data provides confidence in the calculated absorption coefficient for core-shell Si nanowire devices. Although the current diffusion process produces a relatively low effective n-shell doping due to the Fermi-level pinning by the surface states, the physical model predicts very significant enhancement of the absorption coefficient with the increasing doping concentration of the n-shell region, which may be achieved with epitaxial growth or passivation of the surface states.

Figure 9B:
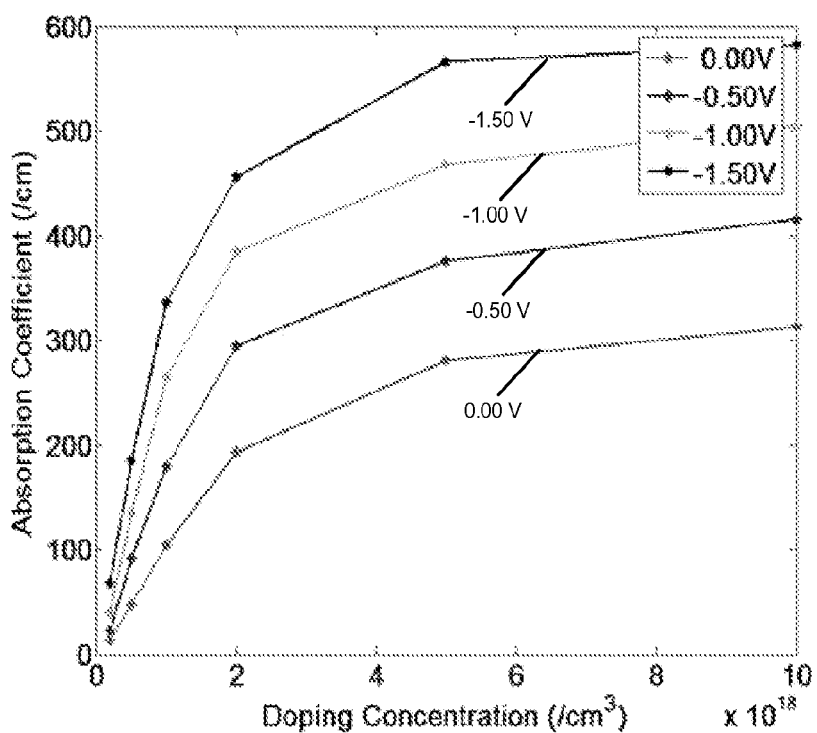
FIG. 9B shows the calculated absorption coefficient dependence on the effective doping concentrations in the n-shell region of a nanowire under different bias conditions.

FIG. 9B shows the calculated absorption coefficient dependence on the effective doping concentrations in the n-shell region of a nanowire under different bias conditions. In all the measurement, the same p-doped core ($10^{19}$ cm$^{-3}$) is used. The results show that the absorption coefficient of Si core-shell nanowires at 1310 nm can reach 313.1 cm$^{-1}$ at 0 V and 582.0 cm$^{-1}$ at −1.5 V. The increase in zero-bias absorption with the doping level of n-shell is particularly dramatic (over 30×). Thus, by increasing the n-shell doping to $10^{18-19}$ cm$^{-3}$, highly efficient Si nanowire IR detectors as well as photovoltaic devices can be achieved.

While the semiconductor devices based on the above-described core-shell nanowire p-n junction structure can utilize the Franz-Keldysh effect, the quasi-quantum confinement effect, and the impurity-state assisted photon absorption to enhance the sub-bandgap and indirect bandgap optical absorptions, semiconductor devices based on other p-n junction configurations without using the core-shell nanowires can also effectuate the three physical mechanisms to enhance the sub-bandgap and indirect bandgap optical absorptions. Generally, a p-n junction structure will effectuate the three physical mechanisms when at least one side (p-side or n-side) of p-n junction structure is constructed to have at least one dimension sufficiently small to induce the spatial confinement; and at least one side (p-side or n-side) of the p-n junction structure is heavily doped to induce a large number of impurity states. In particular embodiments, the dimension that is spatial confined is the dimension in the direction perpendicular to the p-n junction interface (also referred to as "the direction of the p-n junction axis"). In an exemplary p-n junction structure, both the p-type region and the n-type region are constructed to have the respective dimension in the direction perpendicular to the p-n junction interface sufficiently small (e.g., between 5 nm and 300 nm) to induce spatial confinement in both regions; and both the p-type region and the n-type region are heavily doped (e.g., >$10^{18}$ cm$^{-3}$) to induce a large number of impurity states in both regions.

Figure 10:
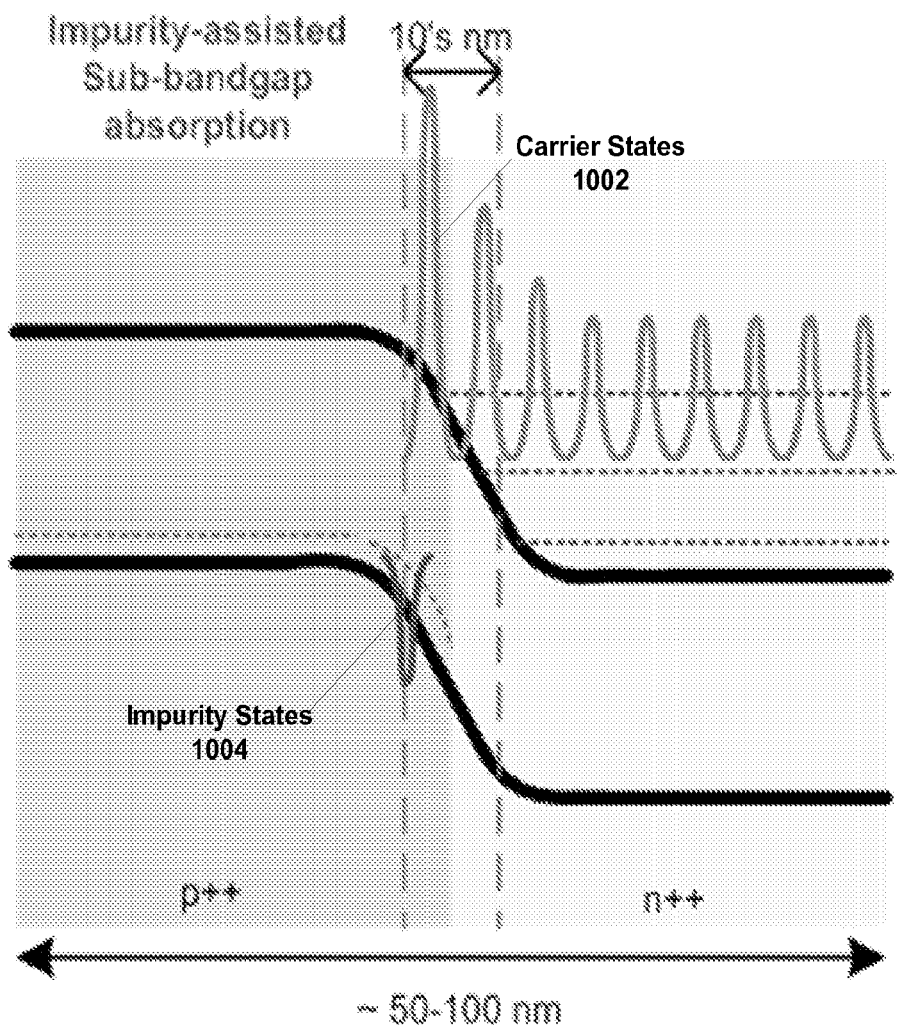
FIG. 10 shows a plot of the concept of sub-bandgap photon absorption illustrating the interaction between a confined electron wavefunction and a localized impurity state wavefunction within an exemplary Si p-n junction wherein both the p-side and n-side are heavily doped and spatial confined.

FIG. 10 shows a plot of the concept of sub-bandgap photon absorption illustrating the interaction between a confined electron wavefunction and a localized impurity state wavefunction within an exemplary Si p-n junction wherein both the p-side and n-side are heavily doped and spatial confined.

As can be seen in FIG. 10, the energetic carrier states 1002 well above the bottom of the conduction band produce a significant large penetration depth (referred to as "wavefunction spillover") to reach the opposite side of the p-n junction. For such energetic carriers, the effective barrier width separating the carrier state 1002 and the impurity state 1004 is significantly lower than the physical width of depletion region to facilitate electron-impurity state coupling. Under a given optical wavelength, the effective barrier width experienced by the energetic carriers is further reduced with increasing reverse bias. Finally, near the top of the potential barrier, the axial velocity of the electron slows down, similar to a pendulum coming to a stop where its kinetic energy is converted into potential energy. This effectively increases the dwelling time (probability) of the energetic electron near the impurity state, thus further increasing the optical absorption coefficient.

Figure 11A:
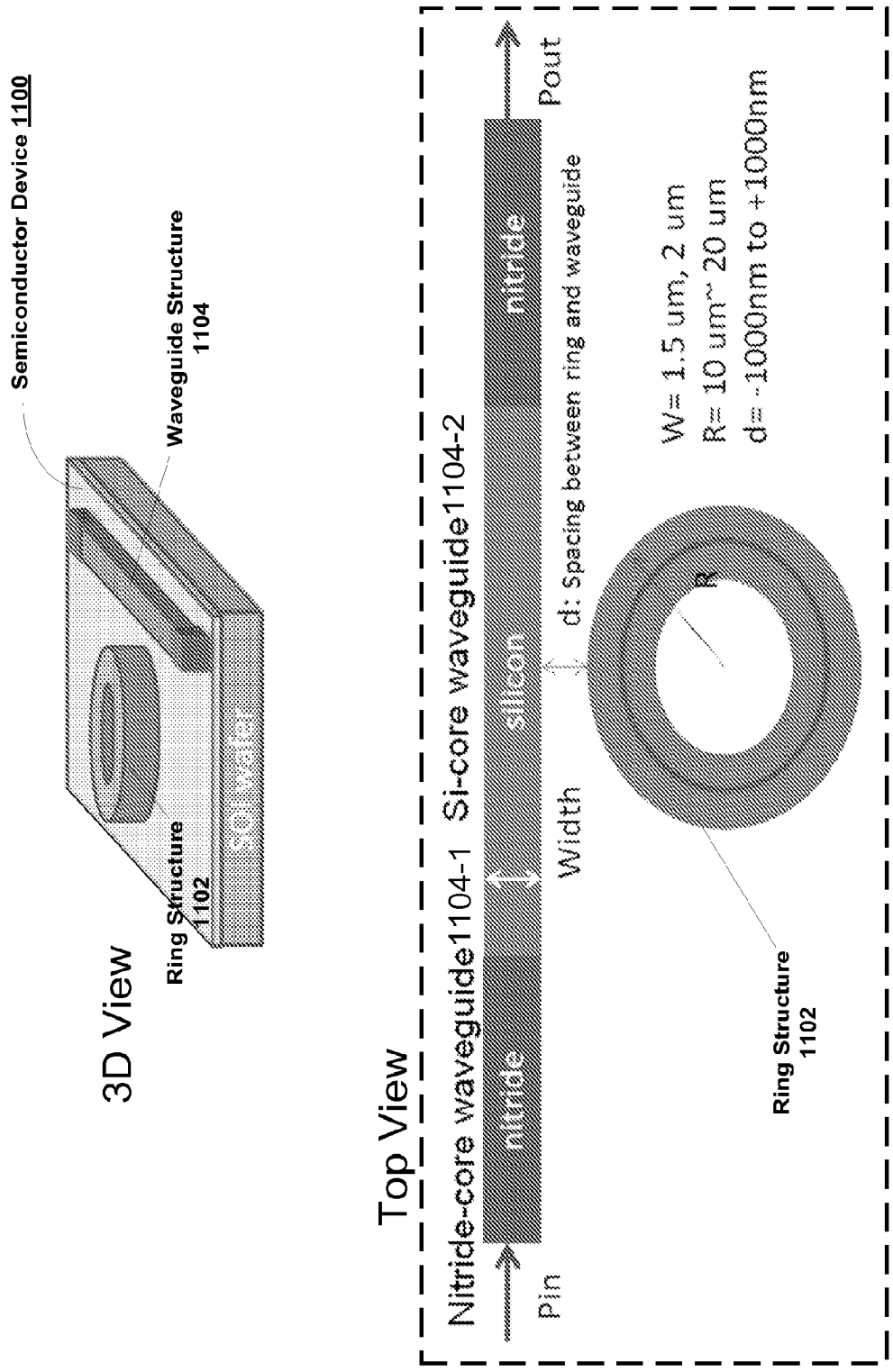
FIG. 11A shows a schematic of an exemplary semiconductor device to detect light (e.g., sub-bandgap photons) without using core-shell nanowires in accordance with some embodiments described herein.

FIG. 11A shows a schematic of an exemplary semiconductor device 1100 to detect light (e.g., sub-bandgap photons) without using core-shell nanowires in accordance with some embodiments described herein. More specifically, semiconductor device 1100 includes a ring structure 1102 optically coupled to a straight waveguide structure 1104, e.g., for coupling in the input light. As shown in the top-view, waveguide structure 1104 of device 1100 can include two parts, i.e., a nitride-core waveguide 1104-1 and a silicon-core waveguide 1104-1. Note that ring structure 1102 and waveguide structure 1104 of device 1100 can be configured in other configurations, e.g., with different waveguide widths W, ring radii R, and spacings between the ring structure and the straight waveguide d. In some embodiments, the silicon-core waveguide includes a p-n junction structure configured to facilitate and enhance sub-bandgap and indirect bandgap optical absorptions. For example, the p-n junction structure may have a multilayer structure fabricated through a process including Si epitaxy.

Figure 11B:
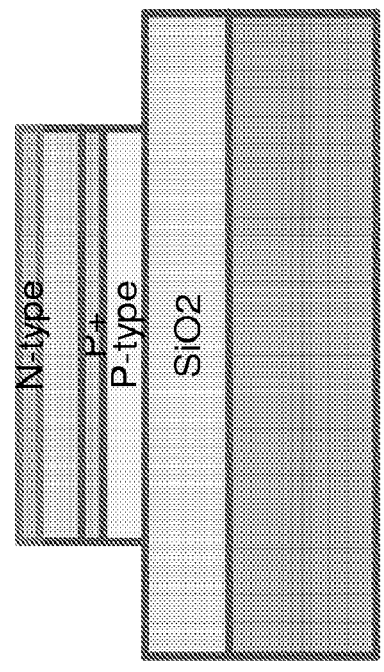
FIG. 11B shows schematics and tables for materials, doping concentrations, and structure dimensions of two exemplary p-n junction structure configurations of the silicon-core waveguide in the semiconductor device in FIG. 11A in accordance with some embodiments described herein.
Figure 11B:
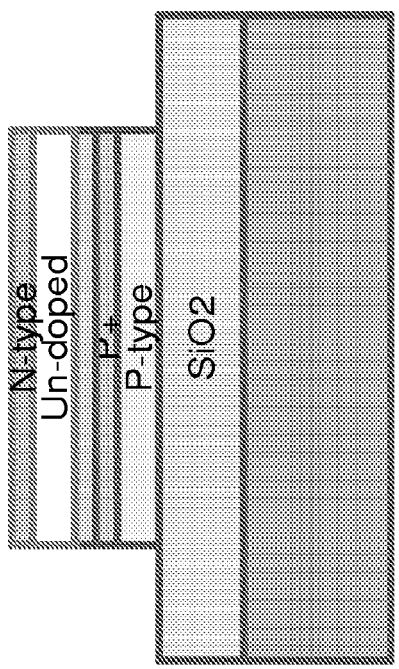

FIG. 11B shows schematics and tables for materials, doping concentrations, and structure dimensions of two exemplary p-n junction structure configurations of the silicon-core waveguide in the semiconductor device in FIG. 11A in accordance with some embodiments described herein. Two types of Si Epi structures are shown: silicon epitaxy (Epi) structure 1 and silicon epitaxy (Epi) structure 2. Note that both of the structures realize spatial confinement in the vertical dimension in both p-type and n-type regions (<200 nm). For example, in Epi structure 1, the heavily doped p+ layer is only 40 nm thick while the overall p-side is 200 nm thick. The first heavily doped n+ layer is only 5 nm thick while the overall n-side is 150 nm thick. In Epi structure 2, the heavily doped p+ layer is only 30 nm thick while the overall p-side is 190 nm thick. The heavily doped n+ layer is only 20 nm thick while the overall n-side is 100 nm thick. Moreover, both of the structures realize heavy doping concentrations in both p-type and n-type regions (>$10^{18}$ cm$^{-3}$). Hence, semiconductor device 1100 using either of the two Si Epi structures can be used for sub-bandgap photon detection without using the core-shell nanowire structures.

Figure 12A:
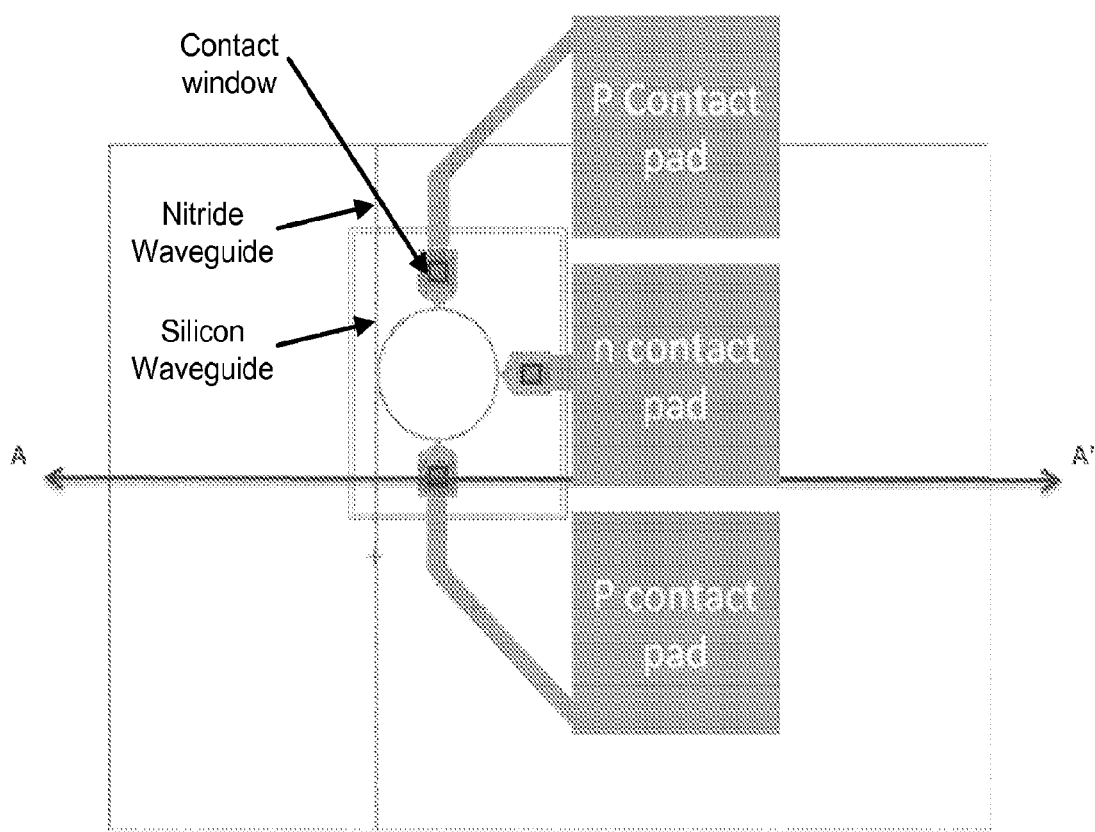
FIG. 12A shows a top-view of a schematic of the exemplary semiconductor device 1100 in accordance with some embodiments described herein.
Figure 12B:
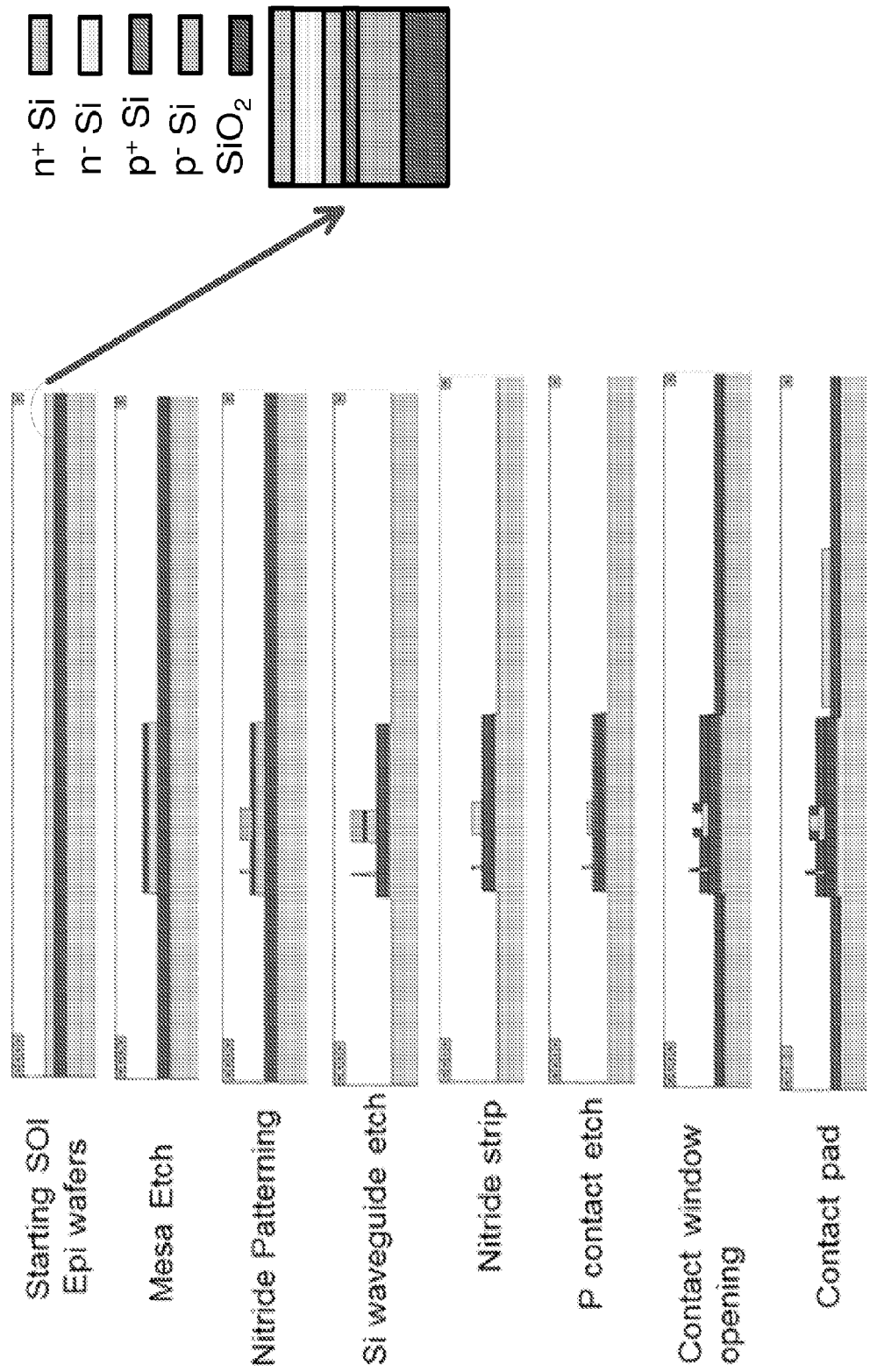
FIG. 12B shows diagrams of an exemplary fabrication process to fabricate semiconductor device 1100.

FIGS. 12A and 12B show schematics and diagrams of an exemplary fabrication process to fabricate the exemplary semiconductor device 1100 in FIG. 11A. Specifically, FIG. 12A shows a top-view of a schematic of the exemplary semiconductor device 1100 in accordance with some embodiments described herein. FIG. 12B shows diagrams of an exemplary fabrication process to fabricate semiconductor device 1100. In particular, the diagrams in FIG. 12B show a cross-section of the schematic of the exemplary semiconductor device along the line A-A' shown in FIG. 12A. The exemplary fabrication process can include a step to etch a starting silicon-on-insulator (SOI) epi wafer to obtain a mesa structure. The exemplary fabrication process can include a step to pattern nitride over the resulting etched wafer. The exemplary fabrication process can include a step to produce a Si waveguide by etching the resulting nitride-patterned wafer. The exemplary fabrication process can include a step to perform nitride striping. The exemplary fabrication process can include a step to perform P-contact etch. The exemplary fabrication process can include a step to create openings as contact window. The exemplary fabrication process can also include a step to deposit a contact pad on the semiconductor device.

Figure 13:
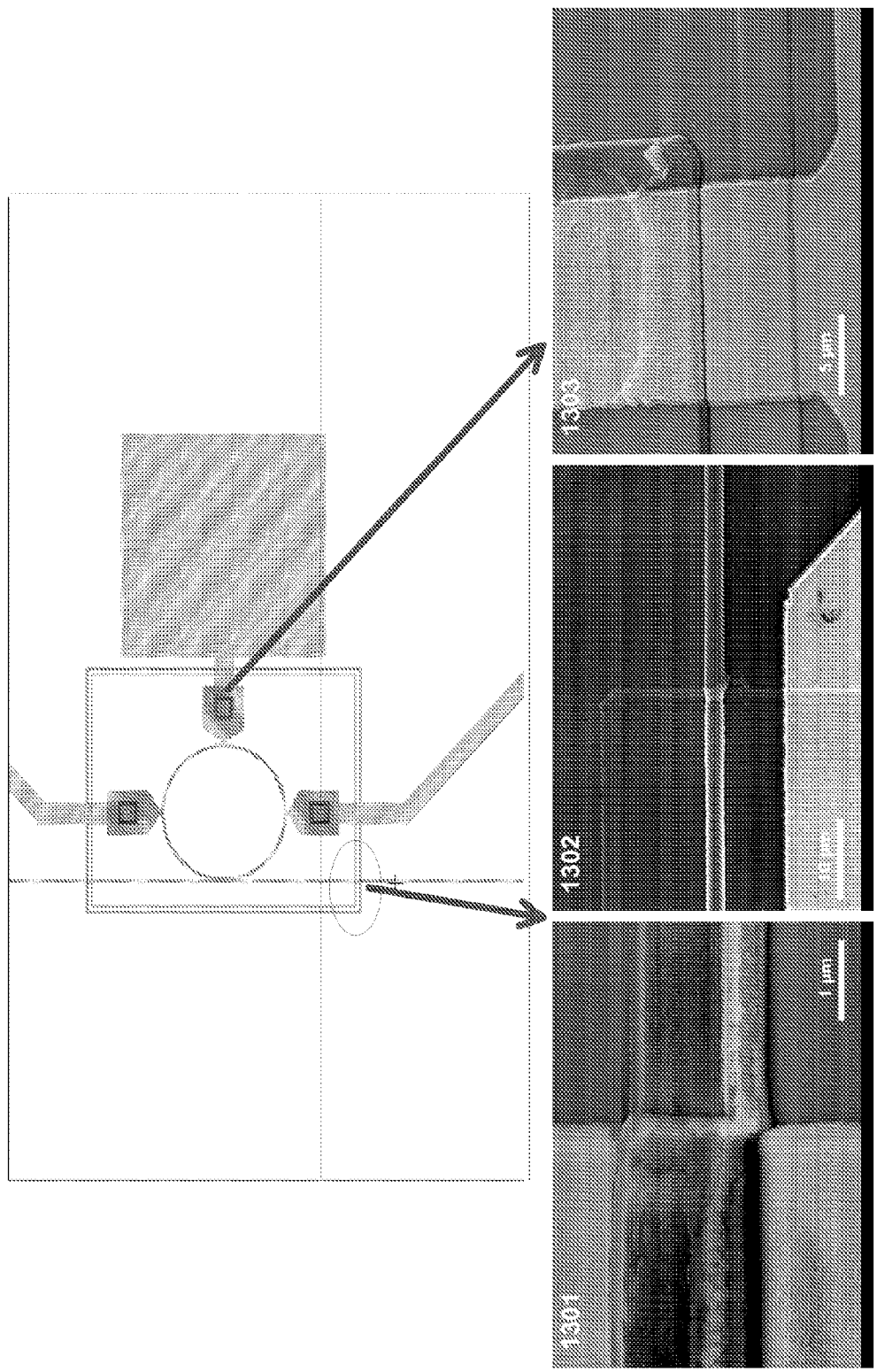
FIG. 13 shows scanning electron microscopy (SEM) images of various regions of a fabricated semiconductor device 1100 to detect light.

FIG. 13 shows scanning electron microscopy (SEM) images of various regions of a fabricated semiconductor device 1100 to detect light. Specifically, images 1301 and 1302 show the junction between the exemplary nitride waveguide and silicon waveguide regions. Image 1303 shows the metal coverage at the contact window and at the junction.

Figure 14A:
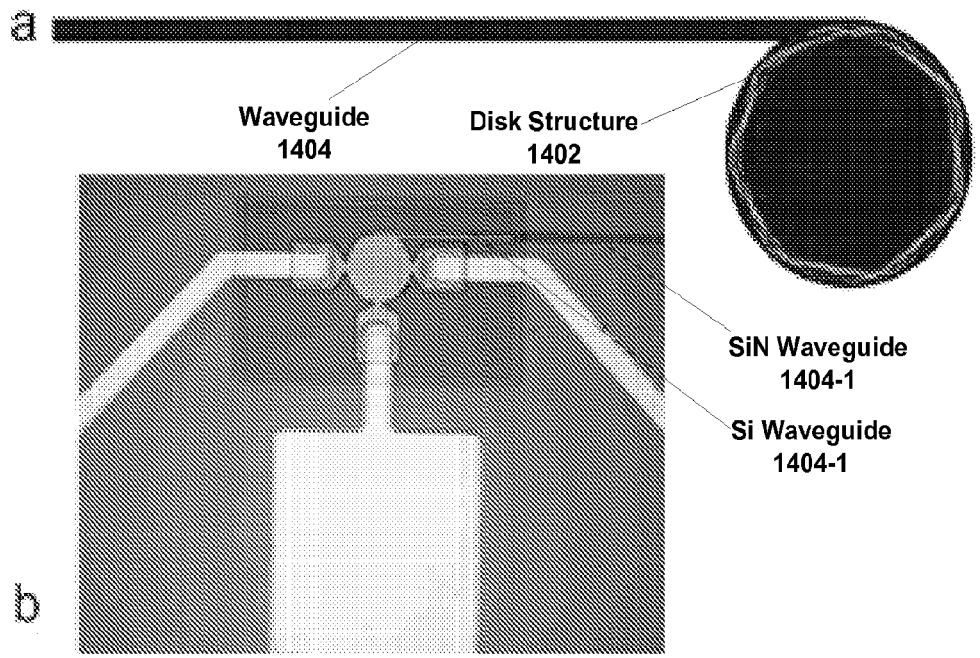
FIG. 14A shows a schematic and an optical image of an exemplary silicon photodetector to detect light (e.g., sub-bandgap photons) without using core-shell nanowires in accordance with some embodiments described herein.

FIG. 14A shows a schematic and an optical image of an exemplary silicon photodetector 1400 to detect light (e.g., sub-bandgap photons) without using core-shell nanowires in accordance with some embodiments described herein. More specifically, subplot (a) in FIG. 14A shows a top-view of the simulated geometry of silicon photodetector 1400, which includes a 1.5 μm wide waveguide 1404 terminated with a 15 μm radius disk structure 1402 that supports whisper gallery modes. It is found that both the disk and ring structures as Si detectors produce nearly identical optical characteristics, while the disk structure may provide lower series resistance and a more precise reading on the actual bias voltage over the p-n junction.

Subplot (b) in FIG. 14A shows an optical image of silicon photodetector 1400. It can be seen in the optical image that waveguide 1404 includes two parts: the SiN waveguide 1404-1 (the darker section) and the Si waveguide 1404-2 (the brighter section) which are butt-coupled to each other. SiN waveguide 1404-1 can couple light into Si waveguide 1404-2, which is directly coupled to disk structure 1402 which has an n-contact at the center and two p-contacts on the sides. Si waveguide 1404-2 and disk structure 1402 together form the Si detector.

Figure 14B:
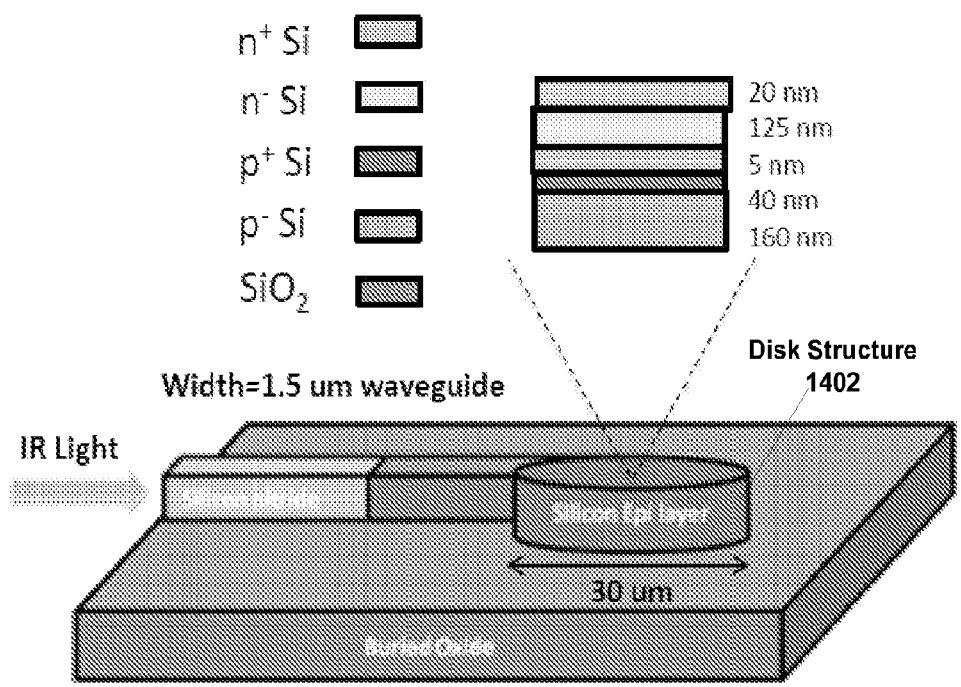
FIG. 14B shows a 3-D view of the silicon photodetector 1400 in accordance with some embodiments described herein.

Silicon photodetector 1400 is fabricated on an SOI substrate. Prior to fabricating the Si detector, a Si homojunction structure is formed on the SOI substrate by OMCVD, which includes a 160 nm thick lightly doped p-Si layer on a 400 nm thick embedded oxide layer, and the epitaxial layers, from the SOI side up, comprises a 40 nm p-Si ($6\times10^{18}$ cm$^{-3}$), 5 nm n-Si ($6\times10^{18}$ cm$^{-3}$), 125 nm n-Si ($2\times10^{17}$ cm$^{-3}$) and 20 nm n-Si ($3\times10^{18}$ cm$^{-3}$). Standard fabrication process can then be used to form the waveguides, ring/disk detectors, and Ohmic contacts on the top n-layer and the bottom p-layer of Si epitaxial material. The Si epitaxial layers on the SOI wafer were photolithography patterned and etched to form the Si waveguide and the ring/disk resonator with one n-contact on the top surface flanked by two p-contacts. The p-contacts can be formed by precisely removing the top 150 nm thick n-layers using dry etch. The lead SiN waveguide that connects the external light source and the Si waveguide can be deposited and patterned on the 400 nm SiO$_2$ of the SOI wafer after removing all the Si epitaxial layers over the SiN waveguide region. In one embodiment, the SiN layer is designed to have the same thickness (350 nm) as Si layers to facilitate the light coupling. The SiN waveguide and the waveguide section of the Si detector can be formed in a self-aligned process. FIG. 14B shows a 3-D view of the silicon photodetector 1400 in accordance with some embodiments described herein. FIG. 14B also shows that disk structure 1402 include all of the epitaxial layers on the original SOI wafer. Note that disk structure 1402 realizes spatial confinement in the direction perpendicular to the p-n junction interface in both p-type and n-type regions (<200 nm). For example, the heavily doped p+ layer is only 40 nm thick while the overall p-side is 200 nm thick. The first heavily doped n+ layer is only 5 nm thick while the overall n-side is 150 nm thick.

To accurately measure light absorption, various other device related factors, such as waveguide loss by free carrier absorption, optical confinement factor, and doping profile control by epitaxial growth are considered. An exemplary fabricated waveguide-coupled detector is determined to have a modal absorption coefficient of around 10 cm$^{-1}$ at 1300 nm wavelength, free carrier absorption below 0.3 cm$^{-1}$, interface state absorption at the top and embedded SiO$_2$/Si interfaces below 0.2 cm$^{-1}$, and ~100 nA in dark current over a bias voltage from −1 V to −2.5 V.

Figure 15:
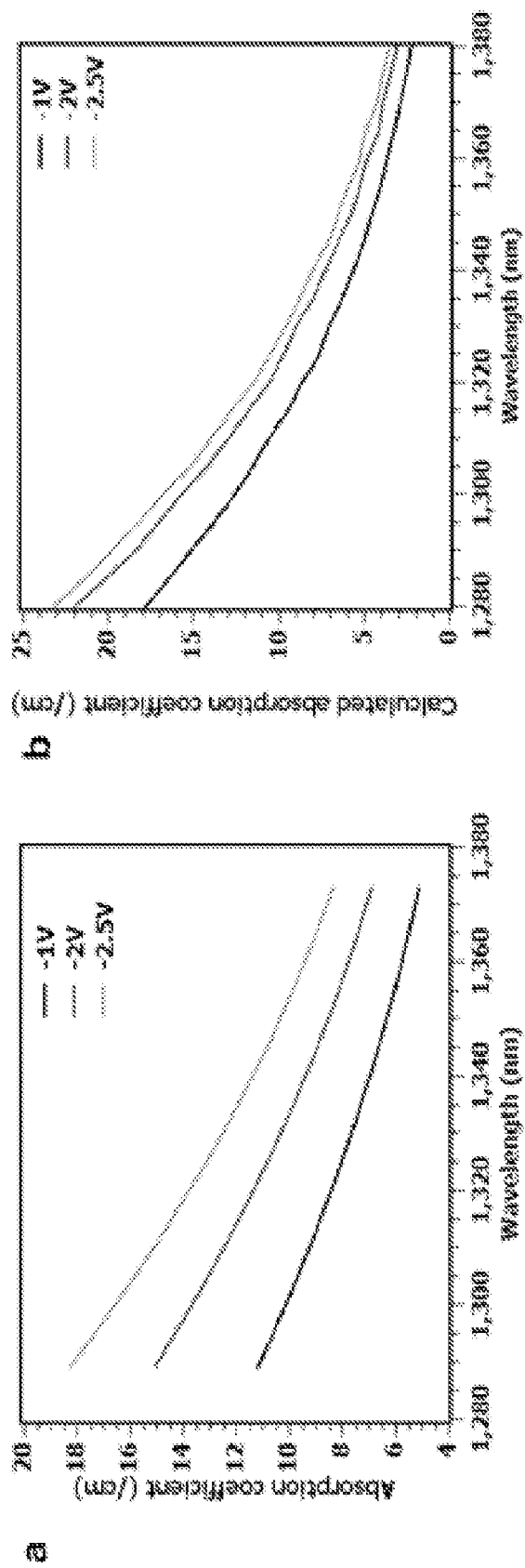
FIG. 15 shows the measured and theoretically calculated wavelength dependent modal absorption coefficient of the proposed silicon photodetector under different bias voltage in accordance with some embodiments described herein.

FIG. 15 shows the measured and theoretically calculated wavelength dependent modal absorption coefficient of the proposed silicon photodetector under different bias voltage in accordance with some embodiments described herein. In one embodiment, the theoretical calculation of modal absorption coefficient is derived from the first principle with an approximated wavefunction for the impurity state. Otherwise the model contains no fitting parameters or empirical formulas. The details of the model are described in Appendix A, which is incorporated by reference as part of the specification of this document. The experiment results (subplot (a)) and theoretical results (subplot (b)) show general agreement on the wavelength dependent characteristics, while the theory predicts a weaker bias dependence and a stronger modal absorption coefficient.

Figure 16:
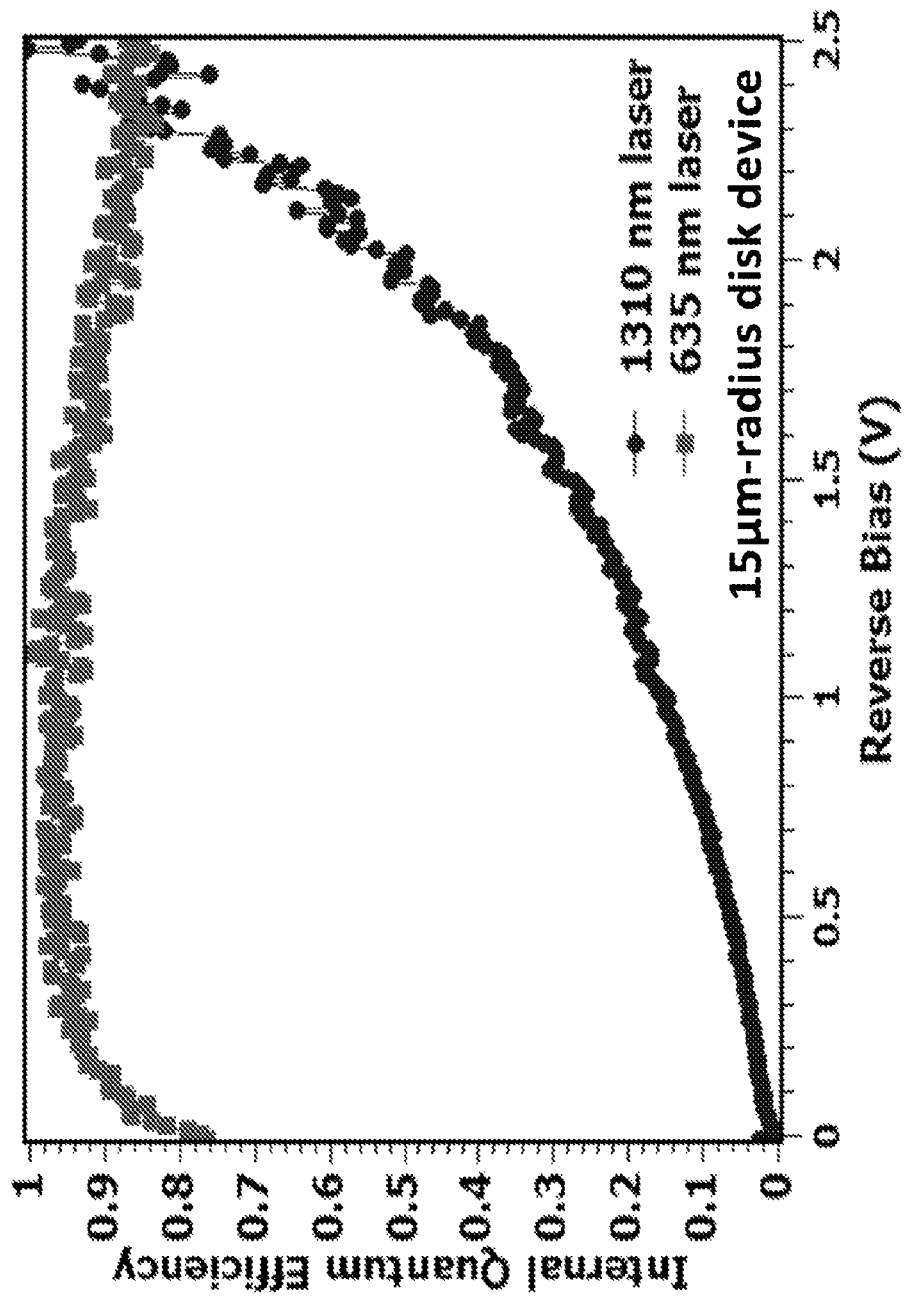
FIG. 16 shows measured data of the different bias dependence of the detector response (by measuring internal quantum efficiency) to 635 nm and 1310 nm light in accordance with some embodiments described herein.

FIG. 16 shows data plots of the different bias dependence of the detector response (by measuring internal quantum efficiency) to 635 nm and 1310 nm light in accordance with some embodiments described herein. More specifically, the data plot corresponding to 635 nm light shows the characteristics of a standard p-n detector and data plot corresponding to 1310 nm light shows bias dependent photoresponse for sub-bandgap absorption. Note that the results demonstrate the fundamentally different absorption mechanisms for the Si structure to photons above and below the energy bandgap. At 635 nm wavelength, photons are absorbed by the entire thickness of 350 nm thick Si and the photocurrent is expected to show minimum dependence on the bias voltage as a standard PIN diode behaves. In clear contrast, the photoresponse to 1310 nm light increases significantly with the increasing bias voltage until the internal quantum efficiency (QE) of the detector approaches 100%. To obtain the internal QE without the uncertainties of extrinsic factors such as insertion loss and SiN waveguide loss, an approach to obtain the internal QE at 1310 nm wavelength for the ring/disk detector was used and discussed in Appendix A.

Figure 17:
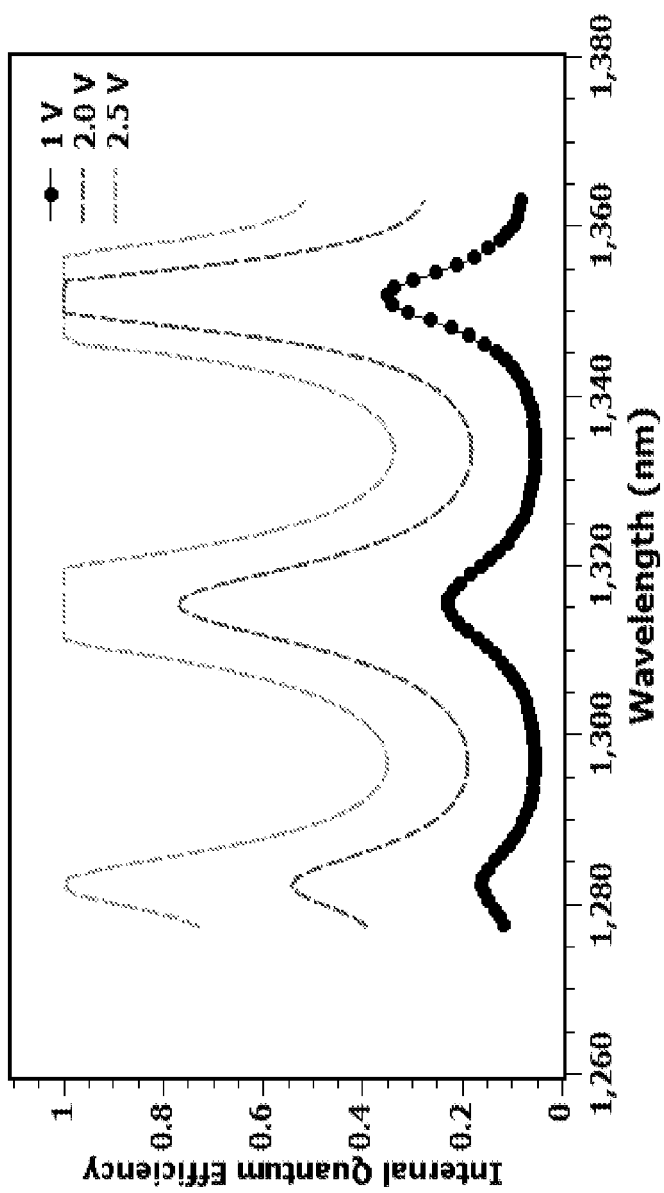
FIG. 17 shows measured wavelength-dependent internal quantum efficiency of a 30 μm diameter disk detector from 1280 nm to 1360 nm under different bias voltage in accordance with some embodiments described herein.

FIG. 17 shows measured wavelength-dependent internal quantum efficiency of a 30 μm diameter disk detector from 1280 nm to 1360 nm under different bias voltage in accordance with some embodiments described herein. Due to the effect of resonant cavities compounded with multi-mode (polarization) interference, the device shows wavelength dependent internal QE. At 2.5V reverse bias, the internal QE near the resonant wavelengths reaches nearly 100% (with 5% error of measurement).

Results from FIGS. 15-17 demonstrate the operation of a high internal QE 1310 nm wavelength detector that is compatible with CMOS and Si photonic integrated circuits (PICs). The proposed silicon detector utilizes the properties of Si without relying on any defects, surface states, or heteroepitaxy, and achieves nearly 100% internal QE in a compact ring/disk structure. The proposed silicon detector utilizes the mechanisms of impurity-state assisted absorption and the interaction between impurity states and high energy sub-bands within the quasi-quantum well. Because the device property can be adjusted by voltage bias, the same principle can also be applied to optical modulators and other active optical components.

The exemplary implementations described above provide various silicon photodetector designs having a voltage dependent photoresponse to both near bandgap and sub-bandgap photons. The proposed devices utilizes three physical mechanisms: Franz-Keldysh effect, quasi-quantum confinement effect, and impurity-state assisted absorption to overcome the inherent limitations of Si as a medium for sub-bandgap infrared absorption. The experimental data match well with the physical model. The disclosed technology can lead to the realization of highly efficient, low cost, and CMOS compatible infrared photodetectors and focal plane arrays using single crystal silicon microstructures and nanostructures. In addition, the voltage dependent behavior of the silicon detector described herein allows more flexibility for the integration with other silicon photonic components. Furthermore, the described techniques and methods can be used to design other optoelectronic devices that require strong electron-hole wavefunction interactions. For example, the disclosed p-n junction structures can be used in light emitting diodes to produce incoherent light at various sub-bandgap wavelengths, in semiconductor lasers to produce coherent light at various sub-bandgap wavelengths. The disclosed p-n junction structures can also be used in photovoltaic devices to produce photon-induced electrical signals at various sub-bandgap wavelengths.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A device to detect light, comprising:
a substrate formed of a first doped semiconductor material, the substrate including a first region and a second region;
an array of multilayered nanowire structures protruding from the first region of the substrate, wherein the nanowire structures are formed of the first doped semiconductor material covered by a first layer of a second doped semiconductor material forming a core-shell structure, the first layer covered by an insulating layer providing electrical isolation of the nanowire structures, wherein the insulating layer includes one or more openings exposing the first layer; and
an electrode formed in the second region and coupled to the first layer of the array of multilayered nanowire structures via the one or more openings in the insulating layer,
wherein the multilayered nanowire structures in the first region function as an optical active region capable of detecting infrared sub-bandgap optical radiation that generates an electrical signal presented at the electrode.

2. The device of claim 1, wherein the first doped semiconductor material includes p-type silicon.

3. The device of claim 1, wherein the second doped semiconductor material includes n-type silicon.

4. The device of claim 1, wherein the insulating layer includes silicon oxide.

5. The device of claim 1, wherein the semiconductor material is silicon and the device is capable of detecting a target optical wavelength between a wavelength near the band-gap of the silicon and 1400 nm.

6. The device of claim 1, wherein the second region of the substrate includes an electrically insulating layer formed over the second region.

7. The device of claim 6, wherein the electrically insulating layer and the insulating layer are the same material.

* * * * *